United States Patent
Umemoto et al.

(10) Patent No.: US 11,830,917 B2
(45) Date of Patent: Nov. 28, 2023

(54) UNIT CELL AND POWER AMPLIFIER MODULE

(71) Applicant: Murata Manufacturing Co., Ltd., Kyoto-fu (JP)

(72) Inventors: Yasunari Umemoto, Nagaokakyo (JP); Shaojun Ma, Nagaokakyo (JP); Shigeki Koya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 706 days.

(21) Appl. No.: 17/027,618

(22) Filed: Sep. 21, 2020

(65) Prior Publication Data

US 2021/0098585 A1    Apr. 1, 2021

(30) Foreign Application Priority Data

Sep. 26, 2019 (JP) .................. 2019-175792

(51) Int. Cl.
| | | |
|---|---|---|
| *H03F 3/14* | (2006.01) | |
| *H01L 29/423* | (2006.01) | |
| *H03F 3/21* | (2006.01) | |
| *H03F 1/02* | (2006.01) | |
| *H01L 27/06* | (2006.01) | |

(Continued)

(52) U.S. Cl.
CPC .... *H01L 29/42304* (2013.01); *H01L 27/0658* (2013.01); *H01L 29/0817* (2013.01); *H01L 29/0826* (2013.01); *H01L 29/1004* (2013.01); *H01L 29/41708* (2013.01);

(Continued)

(58) Field of Classification Search
CPC .......... H01L 29/42304; H01L 27/0658; H01L 29/0817; H01L 29/0826; H01L 29/1004; H01L 29/41708; H01L 29/7371; H01L 29/7304; H01L 21/8252; H01L 27/0605; H01L 2924/3011; H01L 23/66; H03F 1/0205; H03F 3/21; H03F 2200/451;

(Continued)

(56) References Cited

U.S. PATENT DOCUMENTS

| | | | | |
|---|---|---|---|---|
| 9,397,204 B2 * | 7/2016 | Obu | ..................... | H01L 29/7371 |
| 9,859,405 B1 * | 1/2018 | Obu | ..................... | H01L 29/401 |

(Continued)

FOREIGN PATENT DOCUMENTS

| | | |
|---|---|---|
| JP | 2003-086600 A | 3/2003 |
| JP | 2007-027269 A | 2/2007 |
| JP | 2019-033199 A | 2/2019 |

*Primary Examiner* — Khanh V Nguyen
(74) *Attorney, Agent, or Firm* — Studebaker & Brackett PC

(57) ABSTRACT

A collector layer is disposed on a substrate. The collector layer is a continuous region when viewed in plan. A base layer is disposed on the collector layer. An emitter layer is disposed on the base layer. An emitter mesa layer is disposed on the emitter layer. Two base electrodes are located outside the emitter mesa layer and within the base layer when viewed in plan. The two base electrodes are electrically connected to the base layer. Two capacitors are disposed on or above the substrate. Each of the two capacitors is connected between a corresponding one of the two base electrodes and a first line above the substrate. Two resistance elements are disposed on or above the substrate. Each of the two resistance elements is connected between a corresponding one of the two base electrodes and a second line on or above the substrate.

20 Claims, 14 Drawing Sheets

(51) Int. Cl.
*H01L 29/08* (2006.01)
*H01L 29/10* (2006.01)
*H01L 29/417* (2006.01)
*H01L 29/737* (2006.01)

(52) U.S. Cl.
CPC ....... *H01L 29/7371* (2013.01); *H03F 1/0205* (2013.01); *H03F 3/21* (2013.01); *H03F 2200/451* (2013.01)

(58) Field of Classification Search
CPC .... H03F 2200/411; H03F 3/195; H03F 3/213; H03F 3/14
See application file for complete search history.

(56) References Cited

U.S. PATENT DOCUMENTS

| | | | |
|---|---|---|---|
| 11,107,909 B2 * | 8/2021 | Umemoto | H01L 29/42304 |
| 2019/0058054 A1 * | 2/2019 | Sasaki | H01L 29/1004 |
| 2019/0172933 A1 | 6/2019 | Obu et al. | |
| 2019/0214382 A1 | 7/2019 | Koya et al. | |

* cited by examiner

UNIT CELL AND POWER AMPLIFIER MODULE

CROSS-REFERENCE TO RELATED APPLICATION

This application claims benefit of priority to Japanese Patent Application No. 2019-175792, filed Sep. 26, 2019, the entire content of which is incorporated herein by reference.

BACKGROUND

Technical Field

The present disclosure relates a unit cell and a power amplifier module.

Background Art

Heterojunction bipolar transistors (HBTs) are included in power amplifier circuits that are provided for radio-frequency signals and incorporated in, for example, portable terminals or mobile terminals, as described, for example, in Japanese Unexamined Patent Application Publications Nos. 2019-33199 and 2007-27269. Japanese Unexamined Patent Application Publication No. 2019-33199 discloses a heterojunction bipolar transistor including a collector layer, two emitter regions on or above the collector layer, and a base electrode on or above the collector layer and between the two emitter regions. Japanese Unexamined Patent Application Publication No. 2007-27269 touches on a heterojunction bipolar transistor including a collector layer, an emitter region on or above the collector layer, and two base electrodes disposed on or above the collector layer and facing each other across the emitter region.

High efficiency, high gain, high power, and high withstanding voltage are some of the desirable characteristics demanded of heterojunction bipolar transistors included in power amplifier circuits of portable terminals or mobile terminals. With attention focused on the envelope tracking system in recent years, there is a growing need for heterojunction bipolar transistors capable of operating at high collector voltage.

A larger safe operating area (SOA) is required to enable a heterojunction bipolar transistor to operate at high voltage. Transition voltage is an impediment to enlarging the SOA of the heterojunction bipolar transistors known in the art. The transition voltage is defined as a collector voltage at which an SOA line, namely, an SOA boundary obtained by increasing the collector voltage plummets in a graph that represents the relationship between the collector voltage and the collector current.

The heterojunction bipolar transistor disclosed in Japanese Unexamined Patent Application Publication No. 2019-33199 includes a collector layer, two emitter regions on or above the collector layer, and a base electrode on or above the collector layer. Such a heterojunction bipolar transistor is structurally symmetrical as long as the positional relationship between one of the emitter regions and the base electrode is identical to the positional relationship between the other emitter region and the base electrode. The structural symmetry may be lost when, for example, a slight misalignment within an allowable limit is produced between the base electrode and either of the emitter regions. Consequently, the symmetry between flows of current through the two respective emitter regions may be lost.

The heterojunction bipolar transistor mentioned in Japanese Unexamined Patent Application Publication No. 2007-27269 or any other similar transistor including a collector layer, an emitter region on or above the collector layer, and two base electrodes on or above the collector layer may lose its structural symmetry because of such a misalignment. This causes a loss of symmetry between a flow of current through a portion of the emitter region closer to one of the base electrodes and a flow of current through another portion of the emitter region closer to the other base electrode.

The degree of asymmetry between flows of current through any of these heterojunction bipolar transistors may increase when the magnitude of collector current and the magnitude of collector voltage become close to the SOA boundary. As a result, the operation may be further destabilized. The SOA of such a transistor may thus be reduced. Consequently, the heterojunction bipolar transistor may have a narrower operating voltage range and may have less robustness against load fluctuations.

SUMMARY

Accordingly, the present disclosure provides a unit cell that enables enlargement of an SOA by eliminating or reducing the possibility that the degree of asymmetry between flows of current will increase. The present disclosure also provides a power amplifier module including the unit cell.

According to an aspect of the present disclosure, a unit cell includes a collector layer on a substrate, the collector layer being a continuous region when viewed in plan; a base layer on the collector layer; an emitter layer on the base layer; an emitter mesa layer on the emitter layer, the emitter mesa layer providing a path for emitter current carried through the emitter layer; two base electrodes that are located outside the emitter mesa layer and within the base layer when viewed in plan, the two base electrodes being electrically connected to the base layer; two capacitors on or above the substrate, each of the two capacitors being connected between a corresponding one of the two base electrodes and a line for inputting of radio-frequency signals; and two resistance elements on or above the substrate, each of the two resistance elements being connected between a corresponding one of the two base electrodes and a line for application of base bias.

According to another aspect of the present disclosure, a power amplifier module includes a power-stage amplifier circuit including one or more unit cells, each unit cell being the unit cell according to the aforementioned aspect; a driver-stage amplifier circuit including one or more bipolar transistors, each bipolar transistor including a collector layer on the substrate, a base layer on the collector layer, an emitter layer on the base layer, an emitter mesa layer on the emitter layer; and an interstage impedance matching circuit through which a signal amplified by the driver-stage amplifier circuit is input to the power-stage amplifier circuit.

A loss of symmetry between flows of base bias current from the two respective base electrodes to the emitter layer causes a difference between the voltage drop associated with a flow of base bias current through one of the two resistance elements and the voltage drop associated with a flow of base bias current through the other resistance element. That is, the voltage drop at the one resistance element with the flow of current greater in magnitude than the flow of current through the other resistance element is sharper than the voltage drop at the other resistance element. This eliminates or reduces the possibility that the potential difference between the base electrodes will become wider. The difference in the voltage drop at the one resistance element and the voltage drop at the other resistance element is thus instrumental in eliminating or reducing the possibility that the degree of asymmetry between the flows of base bias current will increase. The SOA may be enlarged accordingly.

Other features, elements, characteristics, and advantages of the present disclosure will become more apparent from the following detailed description of preferred embodiments of the present disclosure with reference to the attached drawings.

DETAILED DESCRIPTION

First Example

The following describes a unit cell in a first example and a power amplifier module including the unit cell, with reference to FIGS. 1 to 6.

Figure 1:
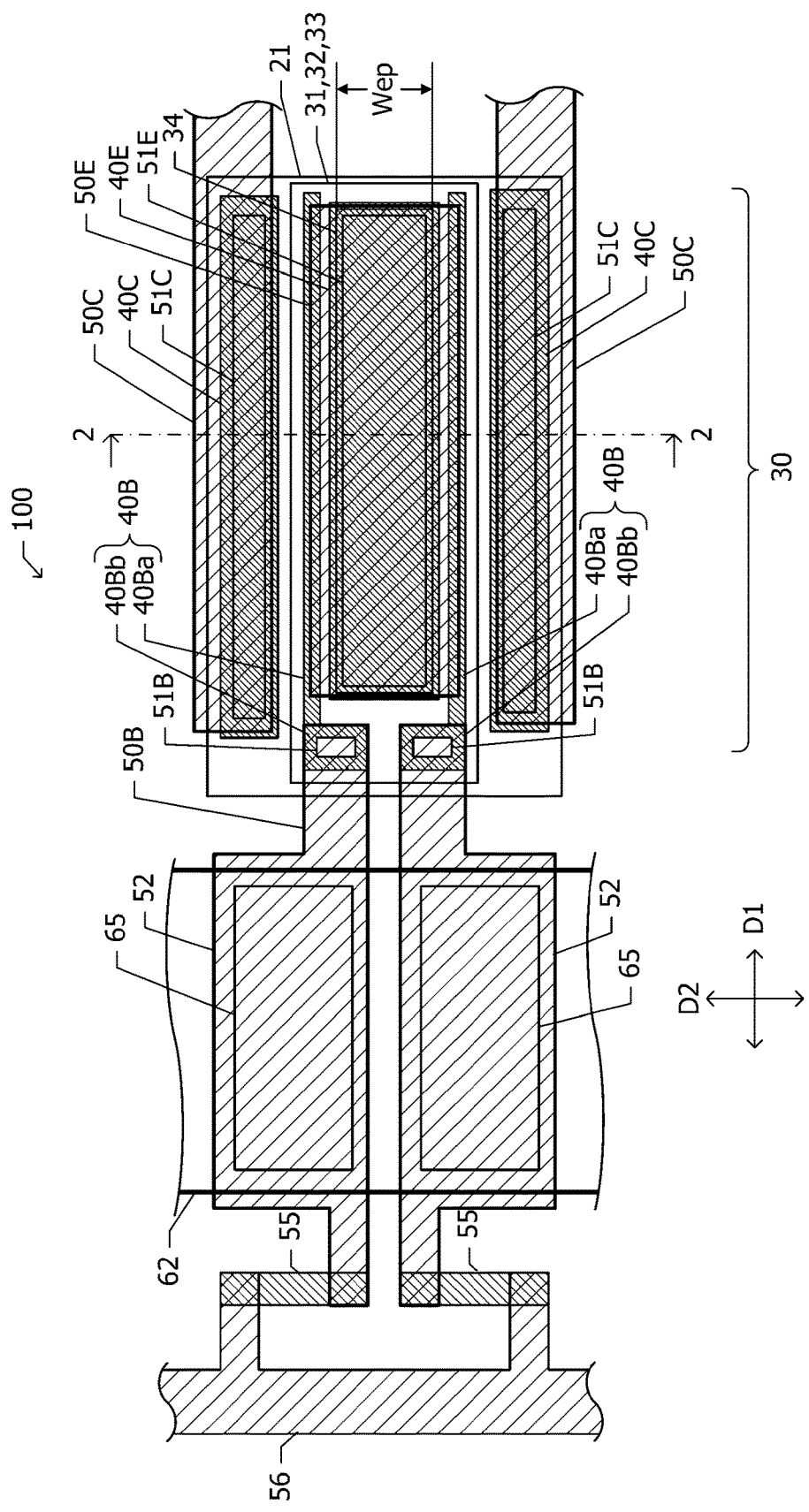
FIG. 1 illustrates planar positional relationship between constituent elements of a unit cell in a first example.

FIG. 1 illustrates planar positional relationship between constituent elements of a unit cell 100 in the first example. The unit cell 100 includes a heterojunction bipolar transistor 30, two capacitors 65, and two resistance elements 55.

A substrate has a surface partially overlaid with a sub-collector layer 21, which has n-type conductivity. The sub-collector layer 21 is, for example, substantially rectangular when viewed in plan. A collector layer 31, a base layer 32, and an emitter layer 33 are located within the sub-collector layer 21 when viewed in plan. The collector layer 31 is a continuous region when viewed in plan. That is, the collector layer 31 viewed in plan is an integral whole instead of being divided into separate regions. The periphery of the base layer 32 and the periphery of the emitter layer 33 respectively coincide with the periphery of the collector layer 31.

An emitter mesa layer 34 is located within the emitter layer 33 when viewed in plan. Part of the emitter layer 33 is overlaid with the emitter mesa layer 34 and actually serves as an emitter region of the heterojunction bipolar transistor 30. The emitter mesa layer 34 is a continuous region within the base layer 32 when viewed in plan. That is, emitter mesa layer 34 viewed in plan is an integral whole instead of being divided into separate regions. The rest of the emitter layer 33 is not overlaid with the emitter mesa layer 34 and is a depletion region through which no emitter current flows.

The emitter mesa layer 34 is long in one direction when viewed in plan. For example, the emitter mesa layer 34 is substantially rectangular when viewed in plan. The direction parallel to the longitudinal direction of the emitter mesa layer 34 is herein referred to as a first direction D1. The direction perpendicular to the first direction D1 is herein referred to as a second direction D2. Two base electrodes 40B are located within the base layer 32 and outside the emitter mesa layer 34 when viewed in plan. The emitter mesa layer 34 is substantially overlaid with an emitter electrode 40E.

Two collector electrodes 40C are located within the sub-collector layer 21 and outside the collector layer 31 when viewed in plan. Referring to FIG. 1, the collector electrodes 40C, the base electrodes 40B, and the emitter electrode 40E are densely hatched with lines slanting up from left to right. When viewed in plan, the two collector electrodes 40C face each other across the collector layer 31 in the second direction.

The two base electrodes 40B each include a base-electrode main portion 40Ba and a base-electrode pad portion 40Bb. The base-electrode main portion 40Ba extends in the first direction DL. The dimension of the base-electrode pad portion 40Bb in the second direction D2 is greater than the dimension of the base-electrode main portion 40Ba in the second direction D2 (the width of the base-electrode main portion 40Ba). When viewed in plan, the two base-electrode main portions 40Ba face each other across the emitter mesa layer 34 in the second direction D2. Each of the two base-electrode pad portions 40Bb is linked to an end portion (a left end in FIG. 1) of the corresponding one of the base-electrode main portions 40Ba. The base electrodes 40B are electrically connected to the base layer 32.

The emitter electrode 40E is in ohmic contact with the emitter mesa layer 34 and is electrically connected to the emitter layer 33 through the emitter mesa layer 34. The emitter electrode 40E lies slightly off the edges of the emitter mesa layer 34 when viewed in plan. That is, the emitter electrode 40E extends beyond the edges of the emitter mesa layer 34 when viewed in plan. The collector layer 31, the base layer 32, the emitter layer 33, the emitter mesa layer 34, the collector electrodes 40C, the base electrodes 40B, and the emitter electrode 40E constitute the heterojunction bipolar transistor 30.

An insulating film extends over the entirety of the substrate so as to cover the heterojunction bipolar transistor 30. Two first-layer collector lines 50C, two first-layer base lines 50B, and a first-layer emitter line 50E are disposed on the insulating film. Referring to FIG. 1, the collector lines 50C, the base lines 50B, the emitter line 50E, and conductor patterns in the wiring layer including these lines are least densely hatched with lines slanting down from left to right.

The collector lines 50C extend through corresponding collector contact holes 51C in the insulating film and are electrically connected to the corresponding collector electrodes 40C accordingly. The collector contact holes 51C are located within the corresponding collector electrodes 40C when viewed in plan. The collector lines 50C respectively extend out from the positions of the corresponding collector contact holes 51C toward one side in the first direction D1 (toward one side in the first direction D1 opposite to the other side on which the base-electrode pad portions 40Bb are disposed, i.e., toward the right side in FIG. 1) and extend beyond an edge of the sub-collector layer 21.

The emitter line 50E extends through an emitter contact hole 51E and is electrically connected to the emitter electrode 40E accordingly. The emitter contact hole 51E is located within the emitter electrode 40E when viewed in plan. The emitter line 50E is located within the collector layer 31 when viewed in plan.

The two base lines 50B extend through two corresponding base contact holes 51B in the insulating film and are electrically connected to the corresponding base-electrode pad portions 40Bb accordingly. The base contact holes 51B are located within the corresponding base-electrode pad portions 40Bb when viewed in plan. The base lines 50B respectively extend out from the positions of the corresponding base contact hole 51B toward one side in the first direction D1 (toward one side in the other side on which the collector lines 50C extend beyond the edge of the sub-collector layer 21, i.e., toward the left side in FIG. 1) and extend beyond another edge of the sub-collector layer 21.

The two base lines 50B are linked to corresponding lower electrodes 52 of the two respective capacitors 65. The lower electrodes 52 of the two respective capacitors 65 are connected through the corresponding resistance elements 55 to a second line 56, which is provided for application of base bias. Referring to FIG. 1, the resistance elements 55 are less densely hatched with lines slanting up from left to right.

When viewed in plan, the two lower electrodes 52 are discretely located away from each other in the second direction D2. A first line 62 for inputting of radio-frequency signals extends in the second direction D2 and lies over the lower electrodes 52. The first line 62 also serves as upper electrodes of the capacitors 65. That is, the base electrodes 40B are connected to the first line 62 through the corresponding base lines 50B and the corresponding capacitors 65. Radio-frequency input signals transmitted through the first line 62 enter the capacitors 65 and are then input to the base electrodes 40B.

The second line 56 is connected to the base electrodes 40B through the resistance elements 55, the lower electrodes 52 of the capacitors 65, and the base lines 50B. Base bias current is sent from the second line 56 to the base electrodes 40B.

Figure 2:
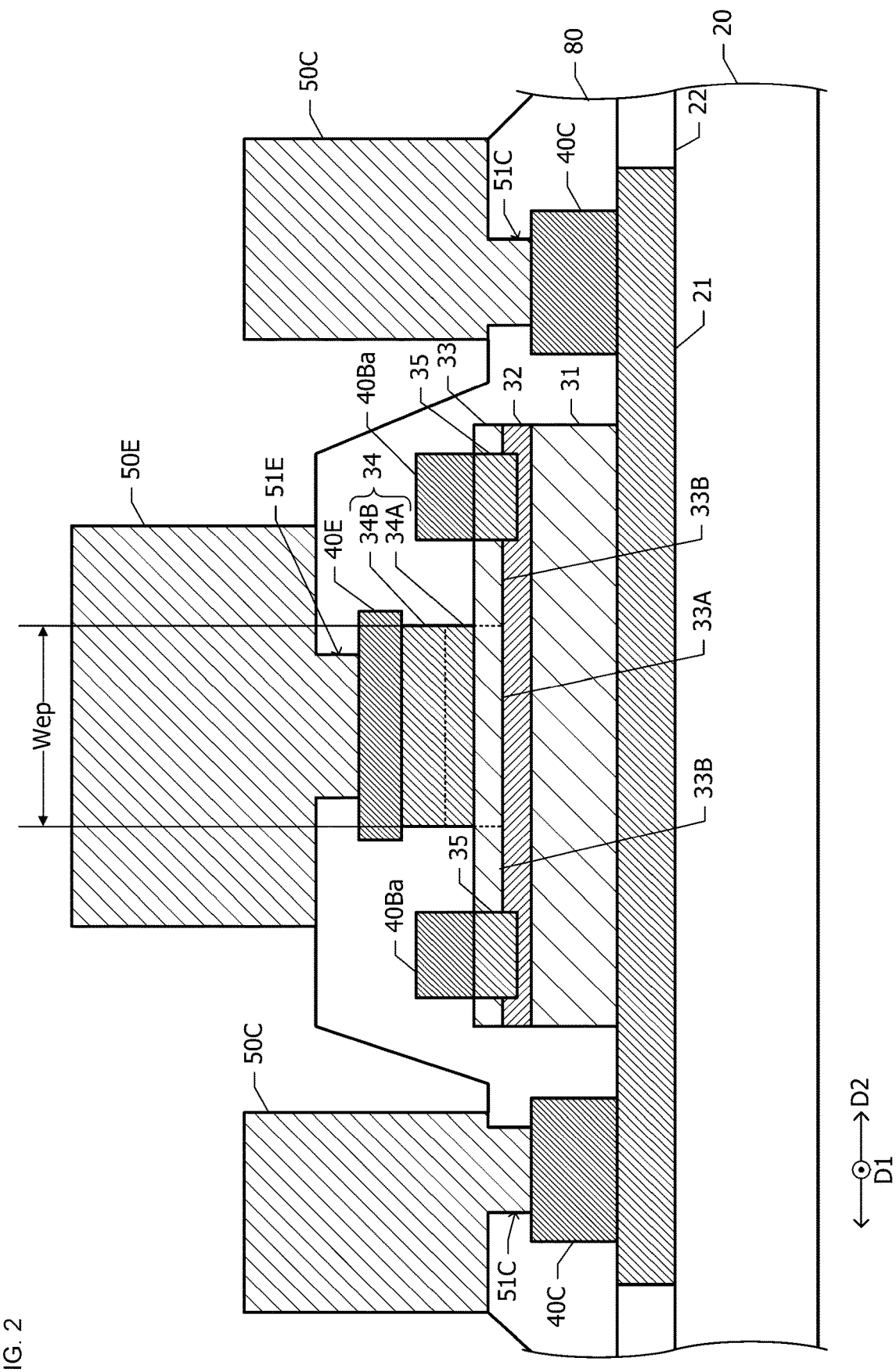
FIG. 2 is a sectional view of the unit cell taken along dash-dot line 2-2 in FIG. 1.

FIG. 2 is a sectional view of the unit cell taken along dash-dot line 2-2 in FIG. 1. The sub-collector layer 21 is provided on part of a substrate 20. The substrate 20 may be a semi-insulating GaAs substrate. The sub-collector layer 21 is, for example, an n-type GaAs layer epitaxially grown on the substrate 20 and having a thickness of not less than about 400 nm and not more than about 1,000 nm (i.e., from about 400 nm to about 1,000 nm). The n-type GaAs layer contains an n-type dopant, or more specifically, is doped with silicon (Si) in a concentration of not less than about $2\times10^{18}$ cm$^{-3}$ and not more than about $4\times10^{18}$ cm$^{-3}$ (i.e., from about $2\times10^{18}$ cm$^{-3}$ to about $4\times10^{18}$ cm$^{-3}$). In place of Si, tellurium (Te) may be used as an n-type dopant. The n-type GaAs layer except for the sub-collector layer 21 is an element isolation region 22, to which insulating properties are imparted by injection of, for example, boron (B), oxygen (O), or helium (He).

The collector layer 31 is disposed on part of the sub-collector layer 21. The base layer 32 is disposed on the collector layer 31. The emitter layer 33 is disposed on the base layer 32. The emitter mesa layer 34 is disposed on part of the emitter layer 33. The emitter mesa layer 34 includes a cap layer 34A and a contact layer 34B. The cap layer 34A is in contact with the emitter layer 33, and the contact layer 34B is disposed on the cap layer 34A.

The collector layer 31 is an n-type GaAs layer doped with Si and having a thickness of not less than about 500 nm and not more than about 2,000 nm (i.e., from about 500 nm to about 2,000 nm). The Si-doping concentration varies in the thickness direction.

The base layer 32 is, for example, a p-type GaAs, InGaAs, or GaAsSb layer doped with carbon (C) and having a thickness of not less than about 50 nm and not more than about 150 nm (i.e., from about 50 nm to about 150 nm). The C-doping concentration is not less than about $1\times10^{19}$ cm$^{-3}$ and is not more than about $5\times10^{19}$ cm$^{-3}$ (i.e., from about $1\times10^{19}$ cm$^{-3}$ to about $5\times10^{19}$ cm$^{-3}$). The sheet resistance of the base layer 32 is not less than about 130 Ω/sq and is not more than about 300 Ω/sq (i.e., from about 130 Ω/sq to about 300 Ω/sq).

The emitter layer 33 is, for example, an n-type InGaP layer doped with Si and having a thickness of not less than about 20 nm and not more than about 50 nm (i.e., from about 20 nm to about 50 nm). The Si-doping concentration is not less than about $2\times10^{17}$ cm$^{-3}$ and is not more than about $5\times10^{17}$ cm$^{-3}$ (i.e., from about $2\times10^{17}$ cm$^{-3}$ to about $5\times10^{17}$ cm$^{3}$).

The cap layer 34A is, for example, an n-GaAs layer doped with Si and having a thickness of not less than about 50 nm and not more than about 200 nm (i.e., from about 50 nm to about 200 nm). The Si-doping concentration is not less than about $2\times10^{18}$ cm$^{-3}$ and is not more than about $4\times10^{18}$ cm$^{-3}$ (i.e., from about $2\times10^{18}$ cm$^{-3}$ to about $4\times10^{18}$ cm$^{-3}$). The contact layer 34B is an n-type InGaAs layer doped with Si and having a thickness of not less than about 100 nm and not more than about 200 nm (i.e., from about 100 nm to about 200 nm). The Si-doping concentration is not less than about $1\times10^{19}$ cm 3 and is not more than about $3\times10^{19}$ cm$^{-3}$ (i.e., from about $1\times10^{19}$ cm$^{-3}$ to about $3\times10^{19}$ cm$^{-3}$).

The two collector electrodes 40C are disposed on a region being part of an upper surface of the sub-collector layer 21 and not being overlaid with the collector layer 31. When viewed in plan, the two collector electrodes 40C face each other across the collector layer 31 in the second direction D2. The collector electrodes 40C are in ohmic contact with the sub-collector layer 21 and are electrically connected to the collector layer 31 through the sub-collector layer 21.

The two base-electrode main portions 40Ba are disposed on a region being part of an upper surface of the emitter layer 33 and not being overlaid with the emitter mesa layer 34. When viewed in plan, the two base-electrode main portions 40Ba face each other across the emitter mesa layer 34 in the second direction D2. The base-electrode main portions 40Ba and the base-electrode pad portions 40Bb (see FIG. 1) are electrically connected to the base layer 32 through an alloy layer 35, which extends through the emitter layer 33 to the base layer 32. The alloy layer 35 is formed by subjecting the material of the base electrodes 40B to a heat treatment process, in which the material is diffused in the emitter layer 33 and is alloyed. Alternatively, the emitter layer 33 may be partially removed to leave a space for the base electrodes 40B, which are in turn in direct ohmic contact with the base layer 32.

The emitter mesa layer 34 is located within the emitter layer 33 when viewed in plan. A region being part of the emitter layer 33 and overlaid with the emitter mesa layer 34 may be hereinafter referred to as an intrinsic emitter layer 33A, and the rest of the emitter layer 33 may be referred to as a ledge layer 33B. The ledge layer 33B is a depletion region, where no emitter current flows. The emitter current flows substantially through the intrinsic emitter layer 33A. The intrinsic emitter layer 33A functions as an emitter region of the heterojunction bipolar transistor. The emitter mesa layer 34 provides a path for emitter current carried through the emitter layer 33.

The emitter electrode 40E is disposed on the emitter mesa layer 34. The emitter electrode 40E is in ohmic contact with the emitter mesa layer 34 and is electrically connected to the emitter layer 33 through the emitter mesa layer 34. The emitter mesa layer 34 may be patterned by undergoing a self-align process, in which the emitter electrode 40E is used as an etching mask. As a result of side etching in the self-align process, side faces of the emitter mesa layer 34 are on the slightly inner side with respect to edges of emitter electrode 40E when viewed in plan. In other words, the emitter electrode 40E has an eaves-like shape extending beyond the side faces of the emitter mesa layer 34 when viewed laterally. Alternatively, the emitter electrode 40E may be located within the emitter mesa layer 34 when viewed in plan.

An insulating film 80 extends over the entirety of the substrate 20 so as to cover the collector electrodes 40C, the base electrodes 40B, and the emitter electrode 40E. The first-layer collector lines 50C and the first-layer emitter line 50E are disposed on the insulating film 80. The collector lines 50C extend through the corresponding collector contact holes 51C in the insulating film 80 and are connected to the corresponding collector electrodes 40C accordingly. The emitter line 50E extends through the emitter contact hole 51E in the insulating film 80 and is connected to the emitter electrode 40E accordingly.

The first-layer base lines 50B (see FIG. 1) are also disposed on the insulating film 80. The first-layer base lines 50B are invisible in the section illustrated in FIG. 2. The base lines 50B extend through the corresponding base contact holes 51B (see FIG. 1) in the insulating film 80 and are connected to the corresponding base-electrode pad portions 40Bb (see FIG. 1) accordingly.

The collector layer 31, the base layer 32, and the emitter layer 33 in this example are provided as a single semiconductor layer. Alternatively, these layers may be semiconductor layers having their respective roles. Similarly, constituent elements such as the collector electrodes 40C, the base electrodes 40B, the emitter electrode 40E, the collector lines 50C, the base lines 50B, the emitter line 50E, and the insulating film 80 may be layers formed from different materials when necessary.

Figure 3:
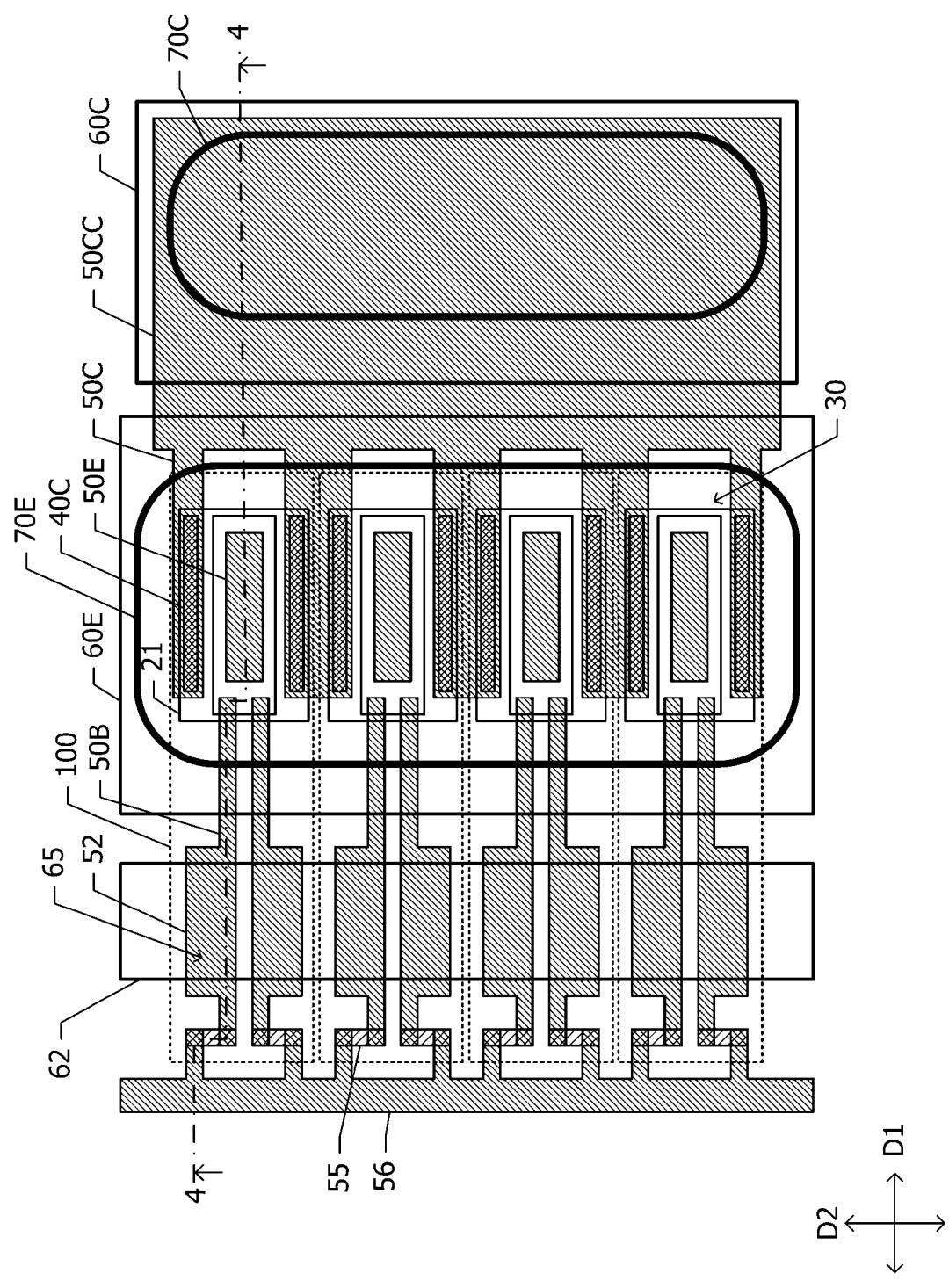
FIG. 3 illustrates planar positional relationship between constituent elements of an amplifier circuit including four unit cells, each of which is the unit cell in the first example.

FIG. 3 illustrates planar positional relationship between constituent elements of an amplifier circuit including unit cells, each of which is the unit cell 100 in the first example. The amplifier circuit illustrated in FIG. 3 includes four unit cells 100. However, the number of unit cells 100 is not limited to this value. Referring to FIG. 3, the first-layer collector lines 50C, the first-layer emitter lines 50E, the first-layer base lines 50B, and the conductor patterns in the wiring layer including these lines are densely hatched with lines slanting up from left to right. The resistance elements 55 are less densely hatched with lines slanting down from left to right. The first-layer collector electrodes 40C are densely hatched with lines slanting down from left to right.

The base electrodes 40B (see FIG. 1), the emitter electrode 40E (see FIG. 1), the collector contact holes 51C (see FIG. 1), the base contact holes 51B (see FIG. 1), the emitter contact holes 51E (see FIG. 1), and cavities of insulating layers on or above the first-layer lines are omitted from FIG. 3.

Referring to FIG. 3, constituent elements of each unit cell 100 are enclosed with a broken line. The unit cells 100 are arranged side by side in the second direction D2 and are connected in parallel.

The emitter lines 50E of the corresponding unit cells 100 are located within a second-layer emitter line 60E when viewed in plan. The second-layer emitter line 60E is connected to the first-layer emitter lines 50E of the unit cells 100. That is, the intrinsic emitter layers 33A (see FIG. 2) of the heterojunction bipolar transistors 30 of the unit cells 100 are connected to a common line, namely, the emitter line 60E.

The first line 62 for inputting of radio-frequency signals is disposed on one side in the first direction D1 with respect to the second-layer emitter line 60E, and a second-layer collector line 60C is disposed on the other side. That is, the second-layer emitter line 60E is disposed between the first line 62 and the second-layer collector line 60C in the first direction D1.

The first line 62 lies over the lower electrodes 52. The first line 62 serves as upper electrodes of the capacitors 65. That is, the upper electrodes of the capacitors 65 of the unit cells 100 are connected to a common line, namely, the first line 62.

The second line 56 for application of base bias is disposed opposite to the second-layer emitter line 60E with the first line 62 therebetween in first direction DL. The second line 56 extends in the second direction D2 and is connected to the lower electrodes 52 through the resistance elements 55. That is, the base electrodes 40B (see FIG. 1) of the unit cells 100 are connected to a common line, namely, the second line 56 through the base lines 50B, the lower electrodes 52, and the resistance elements 55.

A first-layer collector common line 50CC is disposed so as to partially overlap the second-layer collector line 60C. The collector common line 50CC is connected to the collector lines 50C. That is, the collector layers 31 (see FIG. 2) of the heterojunction bipolar transistors 30 of the unit cells 100 are connected to a common line, namely, the collector common line 50CC. Adjoining ones of the collector electrodes 40C of two unit cells 100 adjacent to each other in the second direction D2 are connected with one first-layer collector line 50C; that is, one first-layer collector line 50C is shared by two unit cells 100.

An emitter bump 70E is located within the second-layer emitter line 60E when viewed in plan. The emitter bump 70E is connected to the second-layer emitter line 60E. A collector bump 70C is located within the second-layer collector line 60C when viewed in plan. The collector bump 70C is connected to the second-layer collector line 60C.

Figure 4:
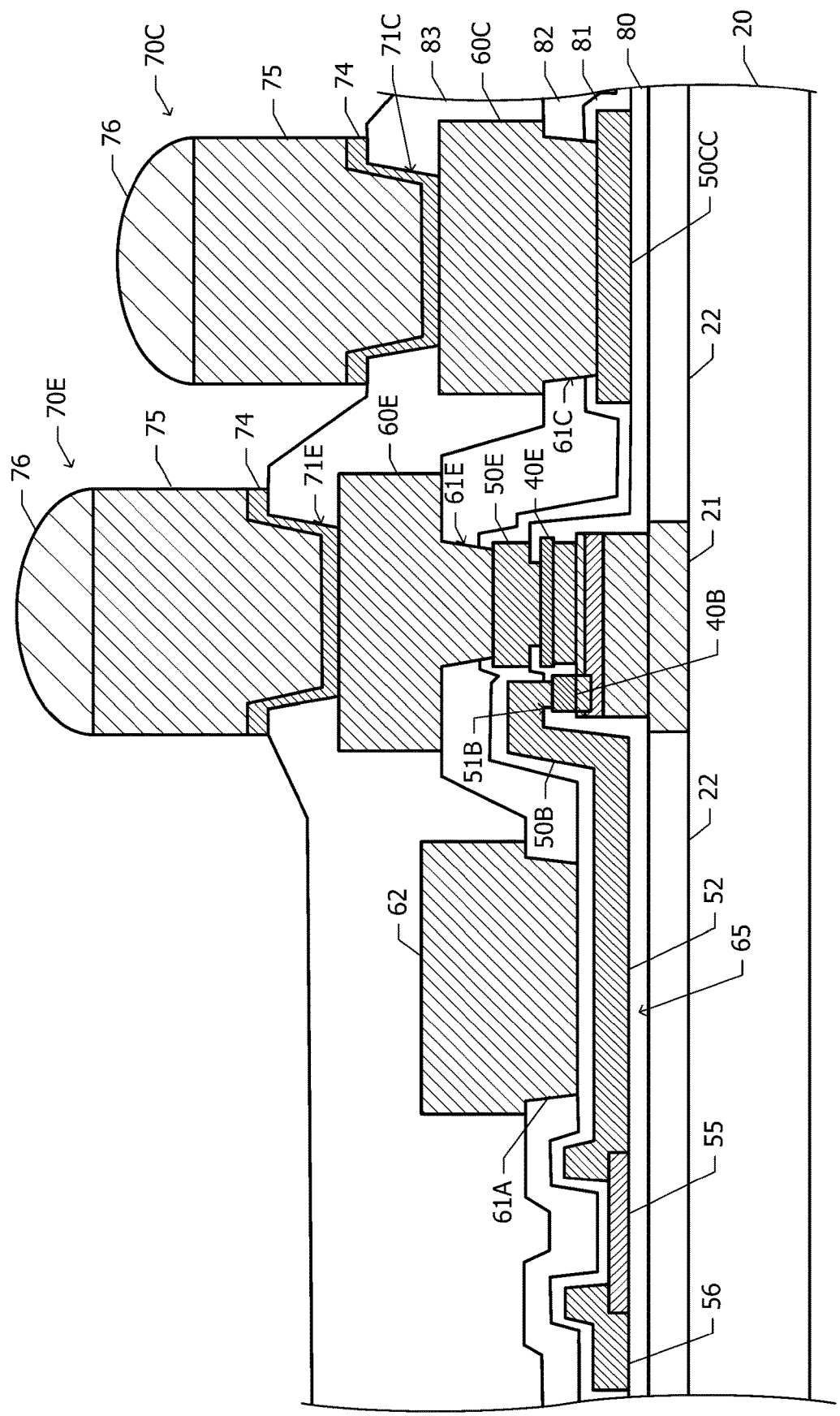
FIG. 4 is a sectional view of the unit cell taken along dash-dot line 4-4 in FIG. 3.

FIG. 4 is a sectional view of the unit cell taken along dash-dot line 4-4 in FIG. 3. Description of components that are not distinct from those in the sectional structure in FIG. 2 will be omitted.

The insulating film 80 extends over the entirety of the substrate 20 so as to cover the emitter electrodes 40E and the base electrodes 40B. The first-layer collector common line 50CC, the first-layer emitter lines 50E, the first-layer base lines 50B, the lower electrodes 52, the resistance elements 55, and the second line 56 for application of base bias are disposed on the insulating film 80. The resistance elements 55 are formed from a thin metal layer. The base lines 50B extend through the corresponding base contact holes 51B in the insulating film 80 and are connected to the corresponding base electrodes 40B accordingly. The base lines 50B are linked to the corresponding lower electrodes 52, each of which is connected to one end of the corresponding one of the resistance elements 55. The other end of each resistance element 55 is connected to the second line 56. The lower electrodes 52, the resistance elements 55, and the second line 56 are disposed on the insulating film 80 on the element isolation region 22. The first-layer collector common line 50CC is also disposed on the insulating film 80 on the element isolation region 22.

An insulating film 81 and an insulating film 82 respectively extend over the entirety of the substrate 20 so as to cover the first-layer collector common line 50CC, the first-layer emitter lines 50E, the first-layer base lines 50B, the lower electrodes 52, the resistance elements 55, and the second line 56. The second-layer collector line 60C, the second-layer emitter line 60E, and the first line 62 for inputting of radio-frequency signals are disposed on the insulating film 82.

The second-layer collector line 60C extends through a collector contact hole 61C in the insulating films 81 and 82 and is connected to the first-layer collector common line 50CC accordingly. The second-layer emitter line 60E extends through an emitter contact hole 61E in the insulating films 81 and 82 and is connected to the first-layer emitter lines 50E accordingly. The first line 62 extends through a capacitor cavity 61A of the insulating film 82 and is in contact with the insulating film 81 underlying the insulating film 82. The insulating film 81 serves as a capacitor dielectric film. The first line 62 and the lower electrodes 52 constitute the capacitors 65. The shape of the capacitor 65 viewed in plan as in FIG. 1 coincides with the shape of the capacitor cavity 61A viewed in plan. The insulating film 81 serving as a capacitor dielectric film is formed from, for example, SiN.

The insulating film 83 extends over the entirety of the substrate 20 so as to cover the second-layer collector line 60C, the second-layer emitter line 60E, and the first line 62. The collector bump 70C and the emitter bump 70E are disposed on an insulating film 83. The collector bump 70C extends through a collector contact hole 71C in the insulating film 83 and is connected to the second-layer collector line 60C accordingly. The emitter bump 70E extends through an emitter contact hole 71E in the insulating film 83 and is connected to the second-layer emitter line 60E accordingly.

The collector bump 70C and the emitter bump 70E each include three layers, namely, an under-bump metal layer 74, a metal pillar 75, and a solder layer 76, which are stacked on one another in the stated order.

Figure 5:
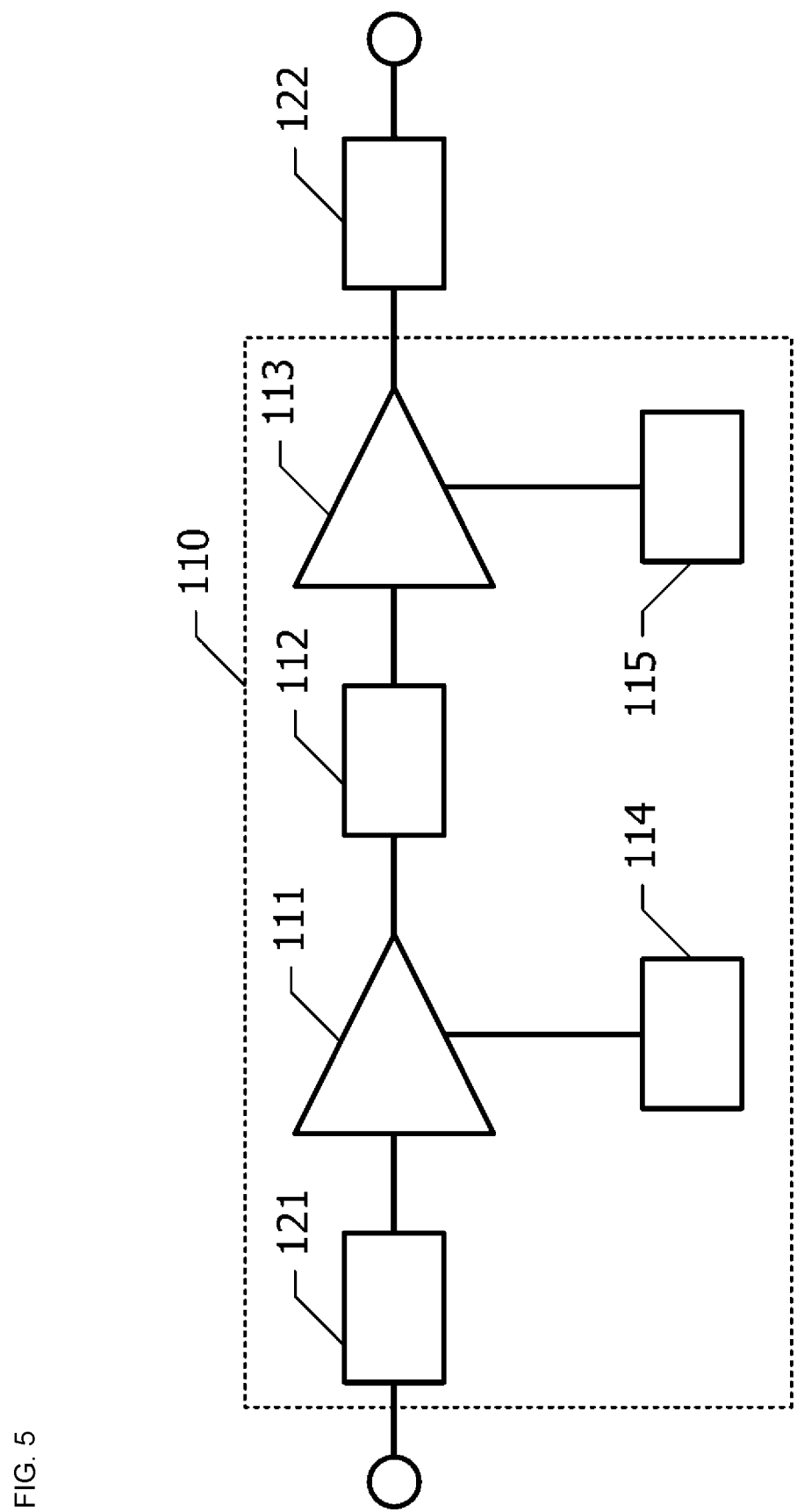
FIG. 5 is a block diagram of a power amplifier module including unit cells, each of which is the unit cell in the first example.

FIG. 5 is a block diagram of a power amplifier module including a power amplifier monolithic microwave integrated circuit (power amplifier MMIC) 110. The power amplifier MMIC 110 includes unit cells, each of which is the unit cell 100 in the first example. The power amplifier MMIC 110 includes an input-side impedance matching circuit 121, a driver-stage amplifier circuit 111, an interstage impedance matching circuit 112, and a power-stage amplifier circuit 113, a bias circuit 114, and a bias circuit 115. An output-side impedance matching circuit 122 is connected to an output terminal of the power-stage amplifier circuit 113. The bias circuits 114 and 115 send bias current to the driver-stage amplifier circuit 111 and the power-stage amplifier circuit 113, respectively.

Radio-frequency signals are transmitted through the input-side impedance matching circuit 121 and are then input to the driver-stage amplifier circuit 111. The radio-frequency signals are amplified by the driver-stage amplifier circuit 111. Resultant signals are transmitted through the interstage impedance matching circuit 112 and are then input to the power-stage amplifier circuit 113. The radio-frequency signals are amplified by the power-stage amplifier circuit 113. Resultant signals are transmitted through the output-side impedance matching circuit 122 and are then output to an external device, such as an antenna.

The amplifier circuit illustrated in FIGS. 3 and 4 is used as the power-stage amplifier circuit 113. The first line 62 for inputting of radio-frequency signals (see FIGS. 3 and 4) corresponds to an input terminal of the power-stage amplifier circuit 113, and the collector bump 70C (see FIGS. 3 and 4) corresponds to an output terminal of the power-stage amplifier circuit 113. The second line 56 for application of base bias (see FIGS. 3 and 4) is connected to the bias circuit 115.

As with the power-stage amplifier circuit 113, the driver-stage amplifier circuit 111 includes unit cells connected in parallel. The unit cells of the driver-stage amplifier circuit 111 have a configuration different from the configuration of the unit cells 100 of the power-stage amplifier circuit 113. The number of unit cells 100 of the power-stage amplifier circuit 113 is greater than the number of unit cells of the driver-stage amplifier circuit 111. The driver-stage amplifier circuit 111 and the power-stage amplifier circuit 113 are formed on a common substrate, namely, the substrate 20 (see FIGS. 2 and 4). The power amplifier MMIC 110 is provided as a single semiconductor chip accordingly.

Figure 6:
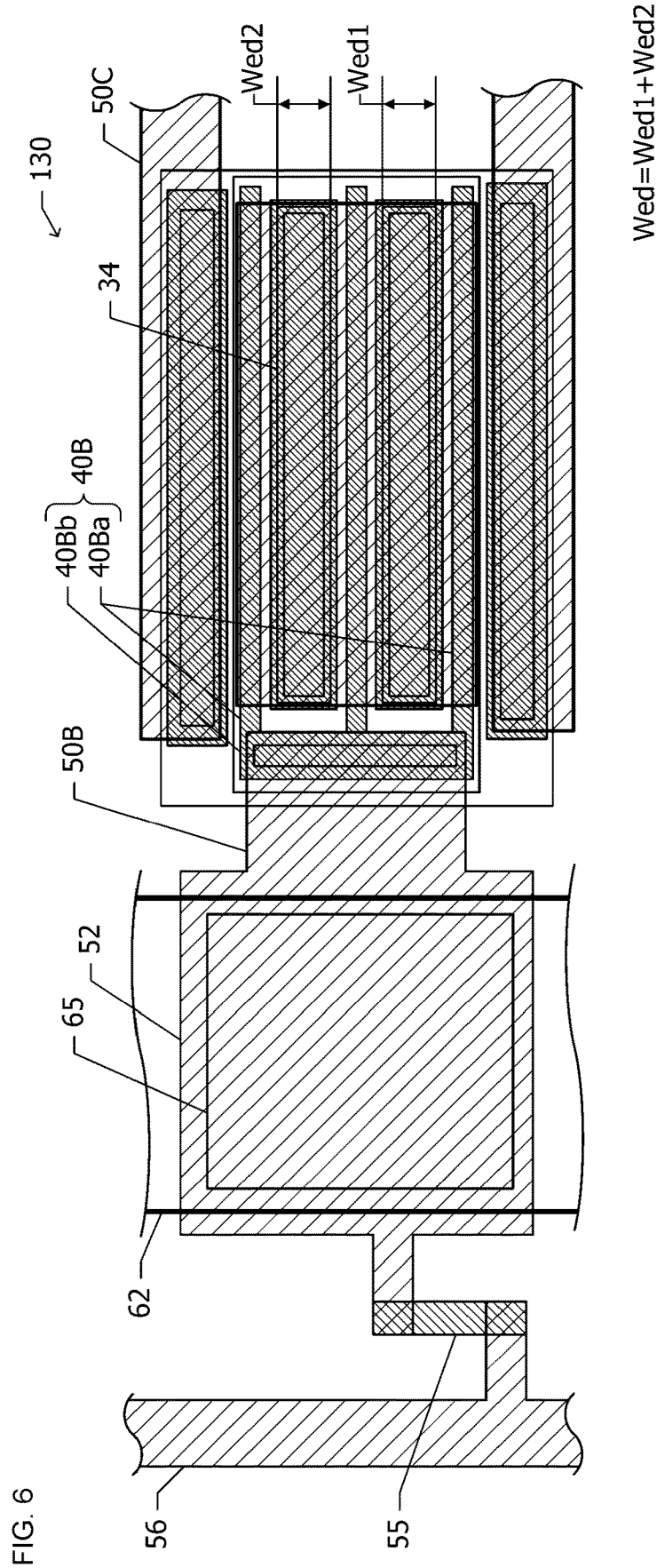
FIG. 6 illustrates planar positional relationship between constituent elements of a unit cell included in a driver-stage amplifier circuit.

FIG. 6 illustrates planar positional relationship between constituent elements of a unit cell 130, which is representative of the unit cells of the driver-stage amplifier circuit 111. Description of configurations identical to those of the unit cell 100 illustrated in FIG. 1 will be omitted. Each constituent element of the unit cell 100 in FIG. 1 and a corresponding constituent element of the unit cell 130 in FIG. 6 are denoted by the same reference sign.

The unit cell 130 of the driver-stage amplifier circuit 111 includes two emitter mesa layers 34, which are discretely located away from each other in the width direction thereof. One base-electrode main portion 40Ba is disposed between the two emitter mesa layers 34, and two base-electrode main portions 40Ba are disposed on corresponding outer sides in the width reaction with respect to the emitter mesa layers 34. End portions of the three base-electrode main portions 40Ba are connected to one base-electrode pad portion 40Bb. That is, the base electrode 40B is a continuous conductor pattern when viewed in plan. With the base electrode 40 being configured as mentioned above, each unit cell 130 includes one capacitor 65 and one resistance element 55 accordingly.

The first line 62 (see FIG. 6) included in the driver-stage amplifier circuit 111 and provided for inputting of radio-frequency signals corresponds to an input terminal of the driver-stage amplifier circuit 111. The first-layer collector lines 50C correspond to an output terminal of the driver-stage amplifier circuit 111. The first line 62 (see FIGS. 1, 3, and 4) included in the power-stage amplifier circuit 113 and provided for inputting of radio-frequency signals is connected to the output terminal of the driver-stage amplifier circuit 111. The collector lines 50C are connected to the input terminal of the power-stage amplifier circuit 113 (see FIG. 5) through the interstage impedance matching circuit 112. The second line 56 (see FIG. 6) of the driver-stage amplifier circuit 111 is connected to the bias circuit 114 (see FIG. 5).

The widths of the two emitter mesa layers 34 of the driver-stage amplifier circuit 111 are respectively denoted by Wed1 and Wed2. Wed1+Wed2, namely, the total width of the two emitter mesa layers 34 is denoted by Wed. Wep (see FIG. 1) denoting the width (the dimension in the second direction D2) of the emitter mesa layer 34 of the unit cell 100 of the power-stage amplifier circuit 113 (see FIG. 5) is greater than Wed (see FIG. 6) denoting the total width (the dimension in the second direction D2) of the emitter mesa layers 34 of the unit cell 130 of the driver-stage amplifier circuit 111 (see FIG. 5). For example, the width Wep is not less than about 1.5 times the total width Wed and is not more than about 2.5 times the total width Wed (i.e., from about 1.5 times the total width Wed to about 2.5 times the total width Wed).

The following describes advantageous effects of the first example.

Base bias current flows through the unit cell 100 in the first example, in the following manner: flows of base bias current from the two respective base-electrode main portions 40Ba (see FIG. 2) are carried through the base layer 32 and the intrinsic emitter layer 33A and are then carried through the emitter mesa layer 34.

The workings in a specific situation will be described below with reference to FIG. 1. In some cases, the magnitude of the base bias current flowing from one of the base-electrode main portion 40Ba into the emitter mesa layer 34 becomes slightly greater than the magnitude of the base bias current flowing from the other base-electrode main portion 40Ba into the emitter mesa layer 34; that is, symmetry between flows of current may be lost. Such a situation can occur when the positional relationship between the emitter mesa layer 34 and one of the two base electrodes 40B and the positional relationship between the emitter mesa layer 34 and the other base electrode 40B are slightly asymmetrical. More specifically, a misalignment within an allowable limit can be produced in the production process, and as a result, the spacing between one of the base-electrode main portions 40Ba and the emitter mesa layer 34 can be slightly smaller than the spacing between the other base-electrode main portion 40Ba and the emitter mesa layer 34. This can cause the situation mentioned above.

With a greater amount of base bias current flowing through a region adjoining an edge of the emitter mesa layer 34, the loss of symmetry between flows of base bias current causes a situation where the magnitude of emitter current flowing though the region concerned is greater than the magnitude of emitter current flowing through a region adjoining another edge of the emitter mesa layer 34. The situation where the flows of emitter current through the regions adjoining the two respective edges of the emitter mesa layer 34 parallel to each other in the first direction D1 is herein referred to as a loss of symmetry between flows of emitter current. The loss of symmetry between flows of emitter current creates asymmetrical distribution of heat generated by the emitter current. When the loss of symmetry between flows of emitter current is left uncompensated and the two base-electrode main portions 40Ba are maintained at the same potential, the loss of symmetry between flows of emitter current will become more significant. That is, the degree of asymmetry between flows of emitter current will increase.

The first example addresses this problem in the following manner. When the magnitude of the base bias current flowing through one of the base-electrode main portions 40Ba is greater than the magnitude of the base bias current flowing through the other base-electrode main portion 40Ba, the voltage drop at the resistance element 55 (see FIG. 1) connected to the one base-electrode main portion 40Ba is sharper than the voltage drop at the resistance element 55 connected to the other base-electrode main portion 40Ba. As a result, the extent of reduction in the potential of the one base-electrode main portion 40Ba with a greater amount of base bias current is greater than the extent of reduction in the potential of the other base-electrode main portion 40Ba. With the potential of the base-electrode main portions 40Ba being reduced, the amount of base bias current is reduced accordingly. This eliminates or reduces the possibility that the degree of asymmetry between flows of base bias current and the degree of asymmetry between flows of emitter current will increase.

In this way, the first example eliminates or reduces the possibility that a loss of symmetry between flows of emitter current will lead to a greater degree of asymmetry. The first example thus produces the advantageous effect of stabilizing the operation of the heterojunction bipolar transistor 30 and enlarging the SOA. Owing to the larger SOA, the heterojunction bipolar transistor 30 can operate at high voltage.

The base parasitic resistance of the transistor in the first example is about half the base parasitic resistance of the transistor including only one base-electrode main portion 40Ba. Owing to the reduction in the base parasitic resistance, the first example produces the advantageous effect of increasing the gain of the heterojunction bipolar transistor.

The first example may be configured in such a manner that the width Wed (see FIG. 6) of the emitter mesa layers 34 of the heterojunction bipolar transistor included in the driver-stage amplifier circuit 111 is equal to the width Wep (see FIG. 1) of the emitter mesa layer 34 of the heterojunction bipolar transistor 30 included in the power-stage amplifier circuit 113. As in the case mentioned above, each heterojunction bipolar transistor of the driver-stage amplifier circuit 111 includes two separate emitter mesa layers 34 and three base-electrode main portions 40Ba. This feature enables a reduction in the base resistance of the driver-stage amplifier circuit 111 and thus produces the effect of increasing the circuit gain.

The power-stage amplifier circuit 113 includes two base-electrode main portions 40Ba, two base-electrode pad portions 40Bb, and two resistance elements 55, each of which is connected to the corresponding one of the base-electrode main portions 40Ba and the corresponding one of the base-electrode pad portions 40Bb. Owing to this feature, a high withstanding voltage may be achieved. This produces the advantageous effect of making the power-stage amplifier circuit 113 greater robustness against load fluctuations. Increasing the width Wep of the emitter mesa layer 34 of each unit cell 100 enables the individual unit cells 100 to generate higher output power. This means that the number of unit cells 100 may be reduced without impairing the high output of the power-stage amplifier circuit 113. The power-stage amplifier circuit 113 may be more compact accordingly.

As mentioned above, the power amplifier module in the first example is advantageous in that the driver-stage amplifier circuit 111 achieves higher gain and the power-stage amplifier circuit 113 has greater robustness against load fluctuations. Thus, the power amplifier module is a high-gain power amplifier module that has greater robustness against load fluctuations. For the desired characteristics demanded of the heterojunction bipolar transistor of the driver-stage amplifier circuit 111 and the desired characteristics demanded of the heterojunction bipolar transistor 30 of the power-stage amplifier circuit 113, the width (Wep) of the emitter mesa layers 34 of the power-stage amplifier circuit 113 is preferably not less than about 1.5 times the total width Wed (see FIG. 6) of the emitter mesa layers 34 of the heterojunction bipolar transistor of the driver-stage amplifier circuit 111 and is preferably not more than about 2.5 times the total width Wed (i.e., from about 1.5 times the total width Wed of the emitter mesa layers 34 of the heterojunction bipolar transistor of the driver-stage amplifier circuit 111 to about 2.5 times the total width Wed).

The desired characteristics demanded of the heterojunction bipolar transistor of the driver-stage amplifier circuit 111 and the desired characteristics demanded of the heterojunction bipolar transistor 30 of the power-stage amplifier circuit 113 may be achieved at the same time by a known power amplifier module in which the multilayer structure of a heterojunction bipolar transistor of a driver-stage amplifier circuit is different from the multilayer structure of a heterojunction bipolar transistor of a power-stage amplifier circuit. Unfortunately, forming two types of heterojunction bipolar transistors with different multilayer structures on one substrate involves complicated production processes.

In the first example, meanwhile, the multilayer structure of the heterojunction bipolar transistor (see FIG. 6) of the driver-stage amplifier circuit 111 is identical to the multilayer structure of the heterojunction bipolar transistor 30 (see FIGS. 1 and 2) of the power-stage amplifier circuit 113. The difference between these heterojunction bipolar transistors in the first example is in the planar shapes of constituent elements viewed in plan and the positional relationship therebetween. Two different types of heterojunction bipolar transistors exhibiting different characteristics are provided accordingly. This approach adds no further complications to the production processes. Thus, the power amplifier module may be less costly.

Figure 7:
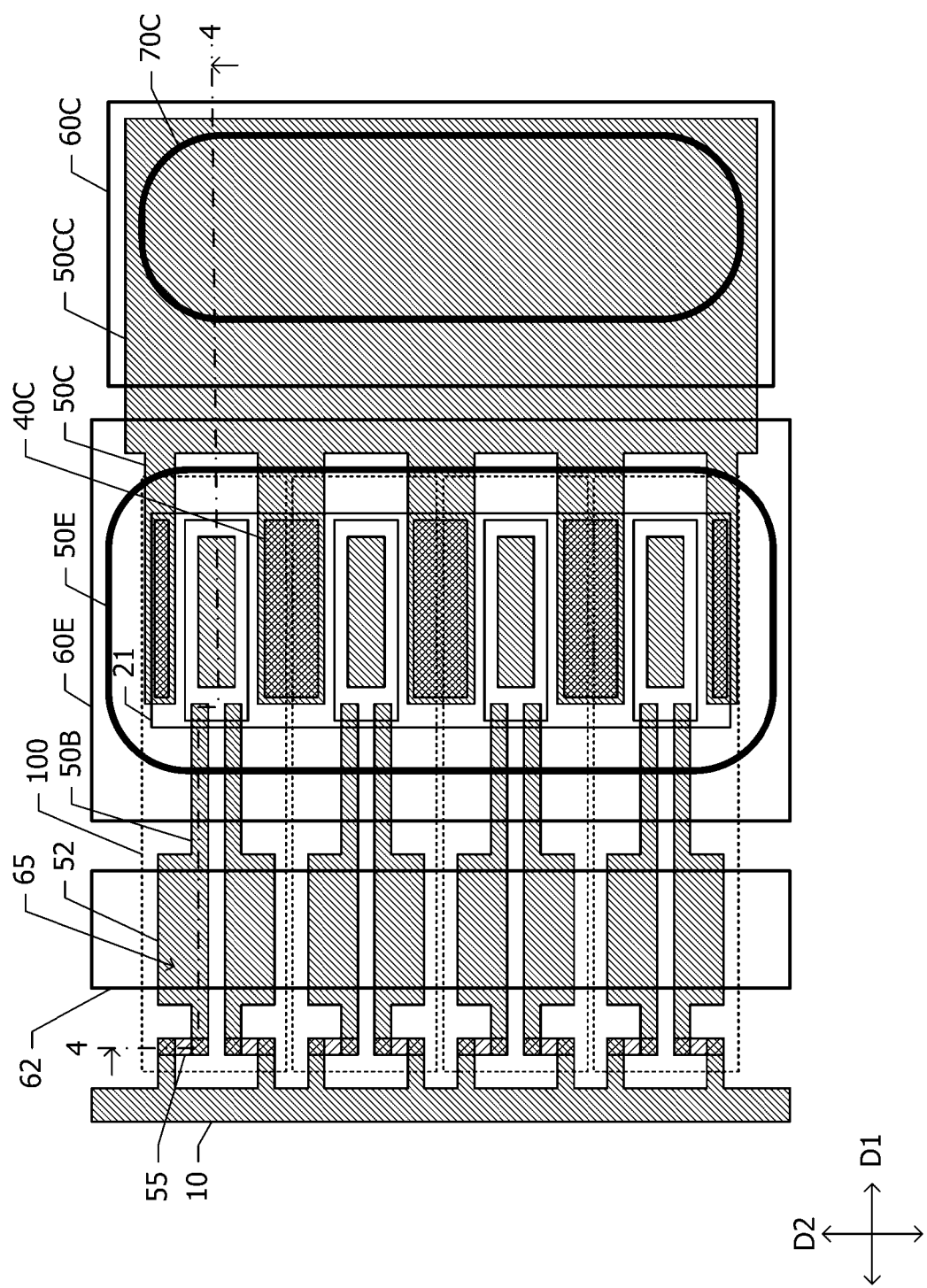
FIG. 7 illustrates planar positional relationship between constituent elements of a power-stage amplifier circuit in a modification of the first example.

The following describes a power-stage amplifier circuit in a modification of the first example with reference to FIG. 7.

FIG. 7 illustrates planar positional relationship between constituent elements of the power-stage amplifier circuit 113 (see FIG. 5) in the modification of the first example. Referring to FIG. 7, the first-layer collector lines 50C, the first-layer emitter lines 50E, the first-layer base lines 50B, and the conductor patterns in the wiring layer including these lines are densely hatched with lines slanting up from left to right, as in FIG. 3. The resistance elements 55 are less densely hatched with lines slanting down from left to right. The collector electrodes 40C are densely hatched with lines slanting down from left to right. The emitter electrodes and the base electrodes are omitted from FIG. 7.

In the first example, the unit cells 100 are provided with their respective sub-collector layers 21 (see FIG. 3). In the modification illustrated in FIG. 7, the sub-collector layer 21 is long in the second direction D2 and extends across the unit cells 100. Adjoining ones of the collector electrodes 40C of the unit cells 100 adjacent to each other in the second direction D2 constitute a continuous conductor pattern.

The following describes advantageous effects of the modification (see FIG. 7) of the first example. In the first example, a spacing equal to or more than the minimum spacing determined on the basis of restrictions associated with production processes is required between two sub-collector layers 21 (see FIG. 3) adjacent to each other in the second direction D2 and between two collector electrodes 40C adjacent to each other in the second direction D2. The modification (see FIG. 7) of the first example eliminates the need to provide the spacing. The unit cells 100 may thus have smaller pitches. This layout enables a reduction in the dimension of the power-stage amplifier circuit 113 in the second direction D2. Thus, a power amplifier module having a smaller chip size may be provided.

The following describes other modifications of the first example.

In the first example, each of the unit cells 100 constituting the power-stage amplifier circuit 113 includes two separate base electrodes 40B (see FIG. 1). Alternatively, at least one of the unit cells 100 may include two separate base electrodes 40B. The other unit cells 100 may each include three base-electrode main portions 40Ba and two emitter mesa layers 34 as illustrated in FIG. 6.

Specific ones of the unit cells 100 can be likely to become damaged during load fluctuations. The likelihood of damage to the individual unit cells 100 may vary depending on the length of the first line 62 provided for inputting of radio-frequency signals and extending from the output terminal of the driver-stage amplifier circuit 111 to the capacitors 65 (see FIG. 3) of the unit cells 100 of the power-stage amplifier circuit 113. As a workaround, the unit cells 100 that are more likely to become damaged may each include two separate base electrodes 40B (see FIG. 1), and the unit cells 100 that are less likely to become damaged may each include three base-electrode main portions 40Ba connected to each other by one base-electrode pad portion 40Bb (see FIG. 6).

Second Example

Figure 8:
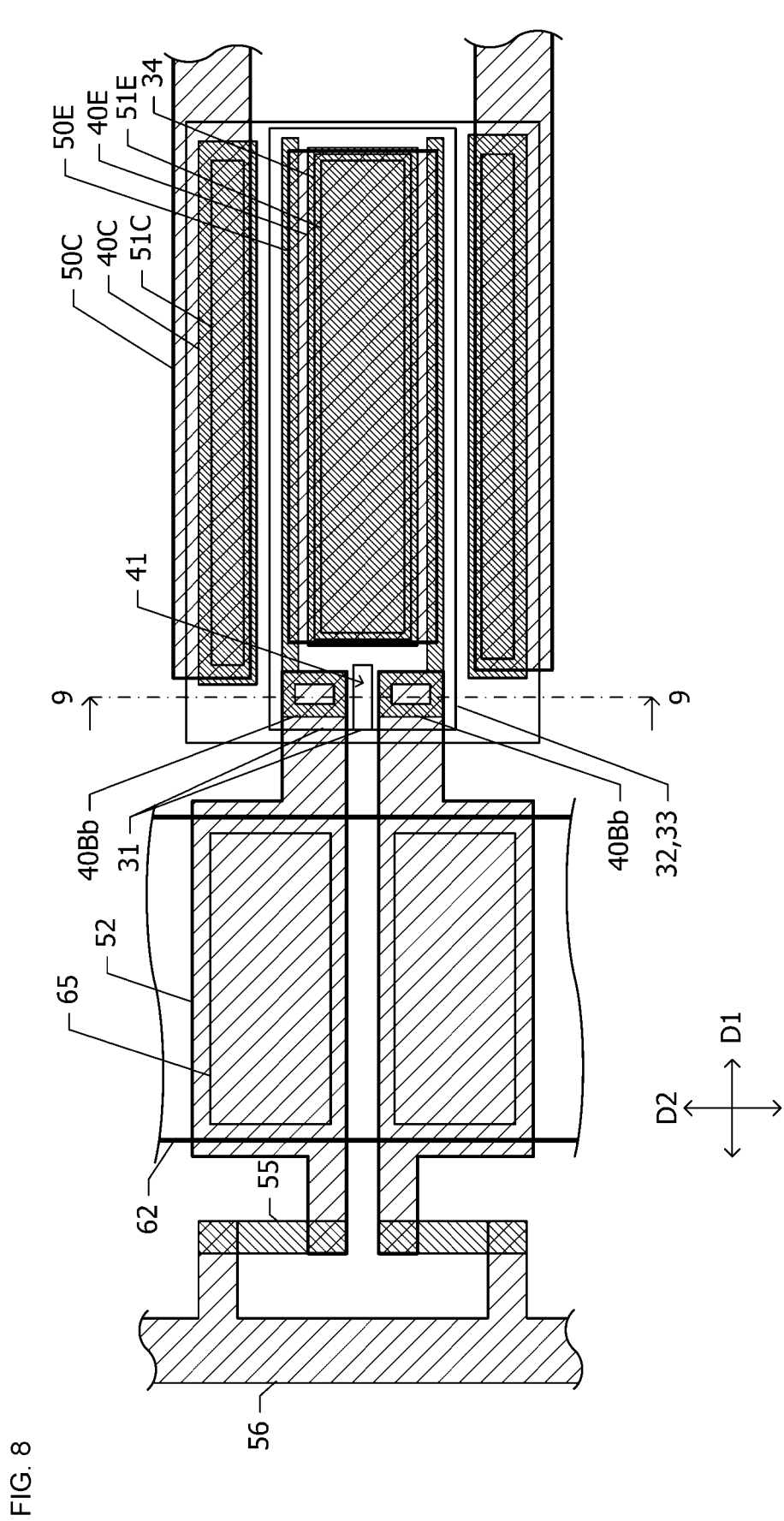
FIG. 8 illustrates planar positional relationship between constituent elements of a unit cell in a second example.
Figure 9:
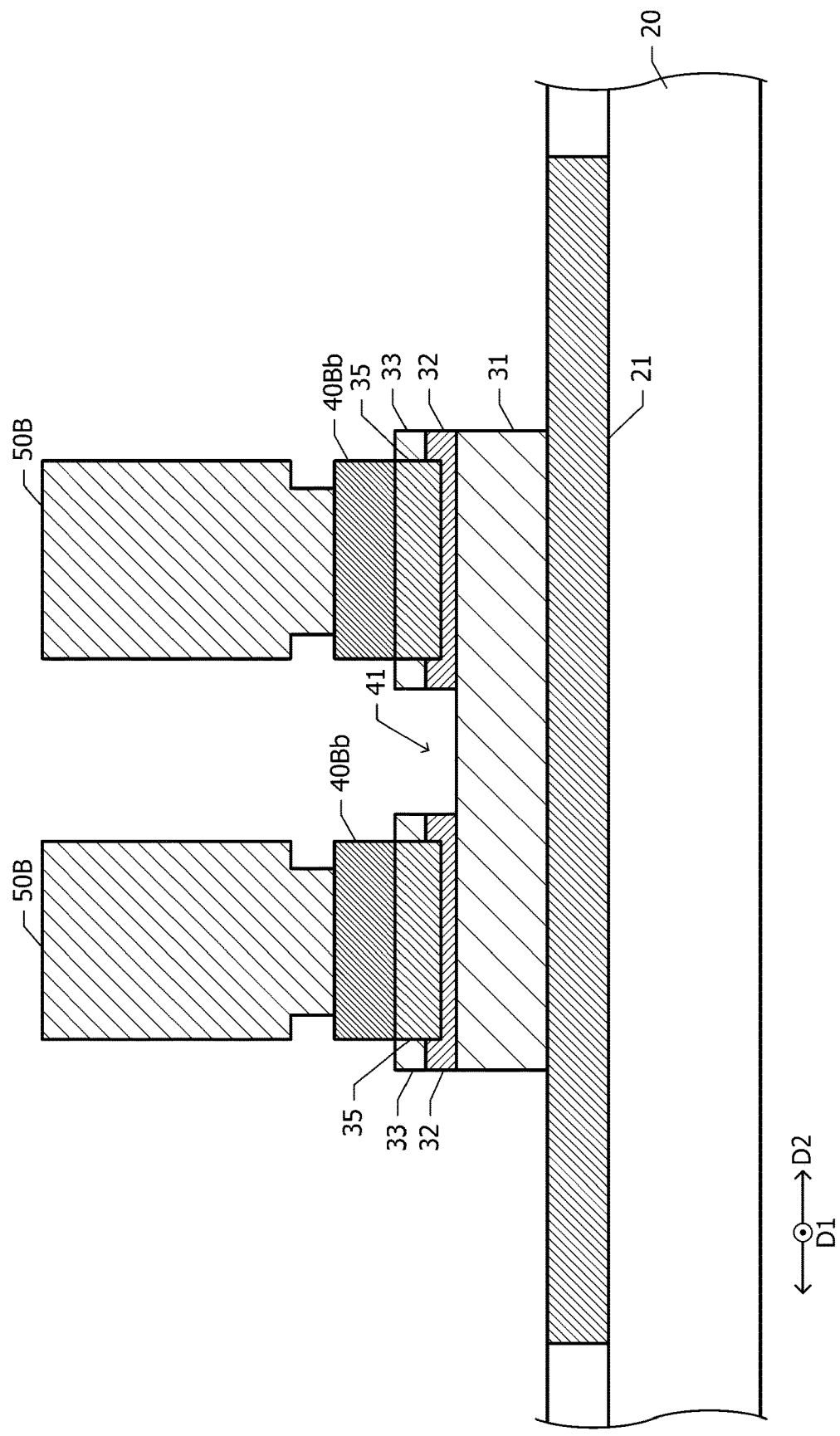
FIG. 9 is a sectional view of the unit cell taken along dash-dot line 9-9 in FIG. 8.

The following describes the unit cell 100 in the second example with reference to FIGS. 8 and 9. Description of configurations identical to those of the unit cells 100 in the first example (see FIGS. 1 and 2) will be omitted.

FIG. 8 illustrates planar positional relationship between constituent elements of the unit cell 100 in the second example. FIG. 9 is a sectional view of the unit cell taken along dash-dot line 9-9 in FIG. 8. In the first example, the base layer 32 and the emitter layer 33 (see FIG. 1) are substantially rectangular when viewed in plan. The region between two base-electrode pad portions 40Bb viewed in plan is entirely overlaid with the base layer 32 and the emitter layer 33. A distinctive feature of the second example is that the region between two base-electrode pad portions 40Bb viewed in plan is overlaid with neither the base layer 32 nor the emitter layer 33. When viewed in plan, the base layer 32 and the emitter layer 33 each have a cutout portion 41, which extends from the midsection of a side of a rectangle and lies between the two base-electrode pad portions 40Bb.

The following describes advantageous effects of the second example.

In the first example, two base-electrode pad portions 40Bb are electrically connected to each other through the base layer 32 disposed therebetween. A distinctive feature of the second example is that the region between two base-electrode pad portions 40Bb is not overlaid with the base layer 32. A greater degree of electrical isolation between the two base electrodes 40B is provided accordingly. This feature thus enhances the effect of eliminating or reducing the possibility that the degree of asymmetry between flows of emitter current through the regions adjoining two respective edges of the emitter mesa layer 34 parallel to each other in the first direction D1 will increase. Consequently, the SOA may be further enlarged, and much greater robustness against load fluctuations may thus be provided.

The following describes the unit cell 100 in a modification of the second example.

As illustrated in FIG. 9, a feature of the second example is that the region between two base-electrode pad portions 40Bb is overlaid with neither the base layer 32 nor the emitter layer 33. An added feature may be that a surface layer portion of the collector layer 31 is removed from the region.

Third Example

Figure 10:
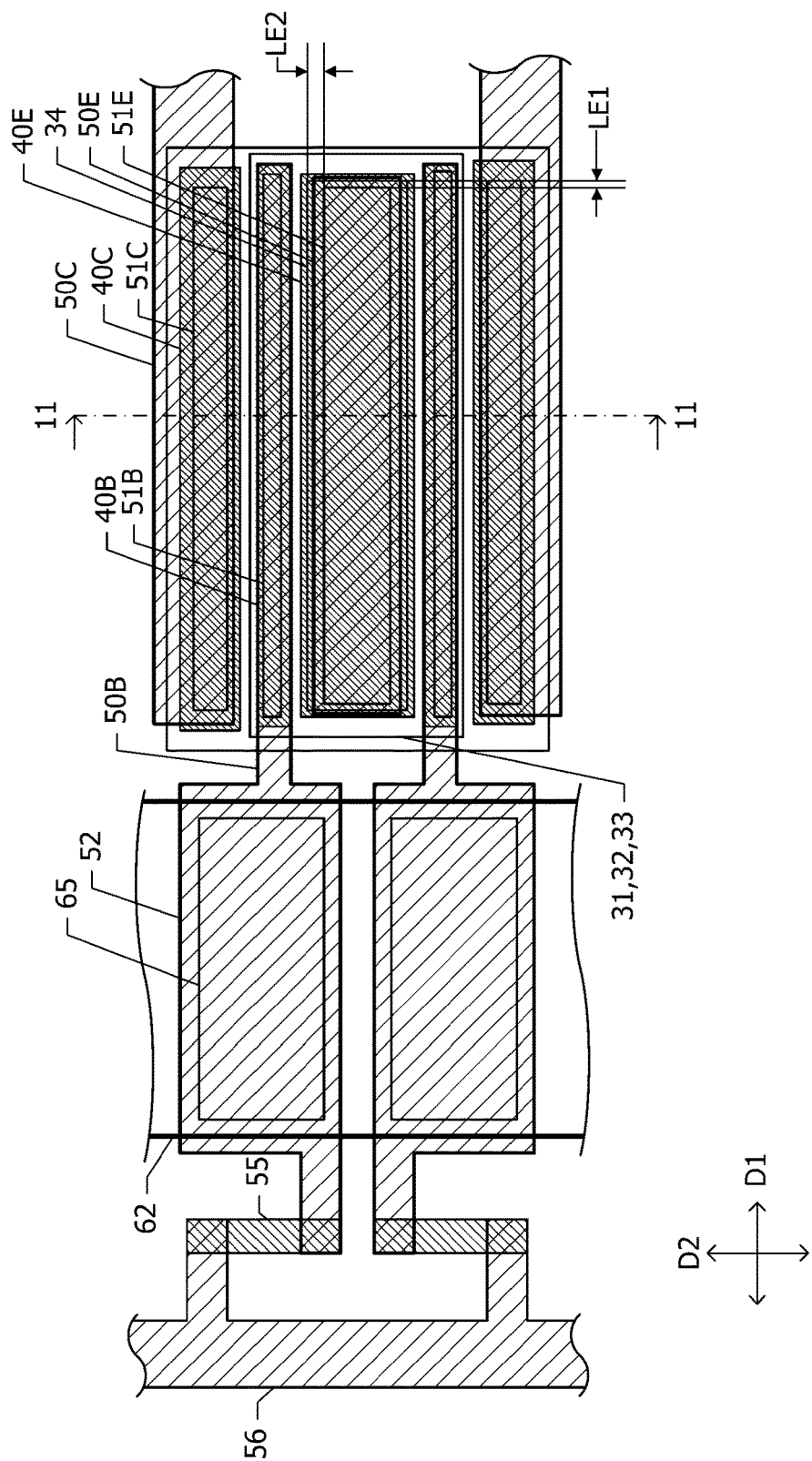
FIG. 10 illustrates planar positional relationship between constituent elements of a unit cell in a third example.
Figure 11:
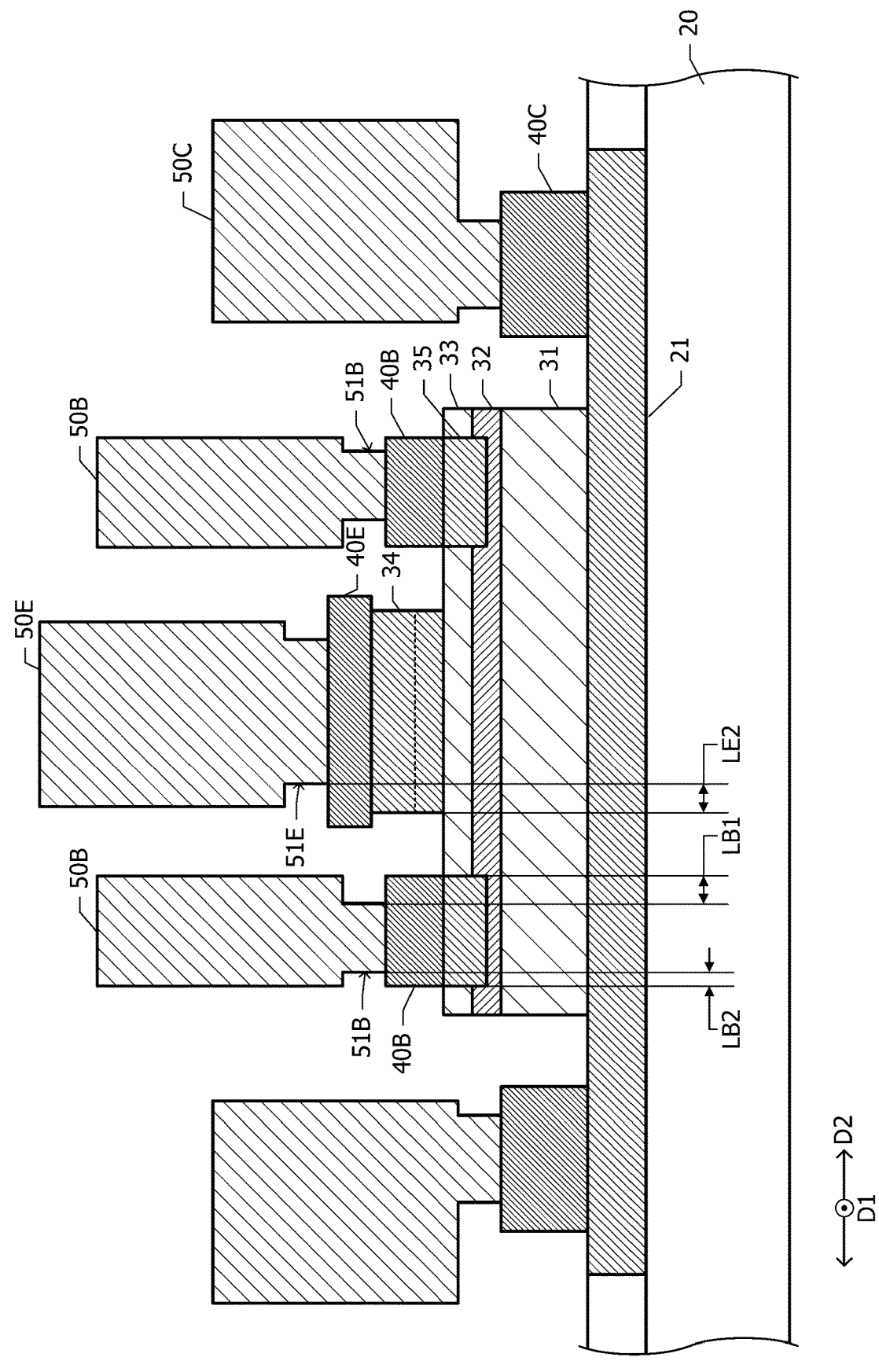
FIG. 11 is a sectional view of the unit cell taken along dash-dot line 11-11 in FIG. 10.

The following describes the unit cell 100 in the third example with reference to FIGS. 10 and 11. Description of configurations identical to those of the unit cell 100 in the first example (see FIGS. 1 and 2) will be omitted.

FIG. 10 illustrates planar positional relationship between constituent elements of the unit cell 100 in the third example. FIG. 11 is a sectional view of the unit cell taken along dash-dot line 11-11 in FIG. 10.

In the first example, the first-layer base lines 50B are connected to the corresponding base-electrode pad portions 40Bb. Distinctive features of the third example are that two base electrodes 40B do not include the base-electrode pad portions 40Bb and each have a substantially rectangular shape that is long in the first direction D1 when viewed in plan. Each base contact hole 51B is long in the longitudinal direction of the base electrodes 40B and extends from a point close to one end of the corresponding base electrode 40B to a point close to the other end of the base electrode 40B concerned. Each first-layer base line 50B extends from one end to the other end of the corresponding base electrode 40B. The first-layer base lines 50B extend through the corresponding base contact holes 51B and are connected to the corresponding base electrodes 40B accordingly.

As illustrated in FIG. 11, LB1 denotes the distance between the base contact hole 51B and an edge closer than any other edge of the base electrode 40B to the emitter mesa layer 34, and LB2 denotes the distance between the base contact hole 51B and an edge farther than any other edge of the base electrode 40B from the emitter mesa layer 34. In the third example, the distance LB1 is greater than the distance LB2. That is, the base contact hole 51B is off-center within the base electrode 40B so as to be farther away from the emitter mesa layer 34 when viewed in plan.

As illustrated in FIGS. 10 and 11, LE2 denotes the distance in the second direction D2 between the emitter contact hole 51E and an edge of the emitter mesa layer 34 extending in the first direction D1. As illustrated in FIG. 10, LE1 denotes the distance in the first direction D1 between the emitter contact hole 51E and an end of the emitter mesa layer 34 in the first direction D1. In the third example, the distance LE2 is greater than the distance LE1.

The following describes advantageous effects of the third example. A distinctive feature of the third example is that the base-electrode pad portions 40Bb (see FIG. 1) in the first example are eliminated. A greater degree of electrical isolation between two base electrodes 40B is provided accordingly. As in the second example (see FIGS. 8 and 9), this feature enhances the effect of eliminating or reducing the possibility that the degree of asymmetry between flows of emitter current through the regions adjoining two respective edges of the emitter mesa layer 34 parallel to each other in the first direction D1 will increase. Consequently, the SOA may be further enlarged, and much greater robustness against load fluctuations may thus be provided.

Base bias current in a direction substantially parallel to the second direction D2 flows through a region being part of the base electrode 40B and extending between the base contact hole 51B and an edge closer than any other edge of the base electrode 40B to the emitter mesa layer 34. The electrical resistance in this region of the base electrode 40B is inserted in series with the resistance element 55 (see FIG. 10). When the distance LB1 is greater than the distance LB2, higher resistance is inserted in series with the resistance element 55 (see FIG. 10). This produces an effect equivalent to increasing the resistance value of the resistance element 55.

Another feature is that the distance LE2 (see FIGS. 10 and 11) is greater. The following describes the effect produced by this feature. Emitter current in the region immediately below the emitter contact hole 51E flows through the emitter electrode 40E substantially in the thickness direction of the emitter electrode 40E. Meanwhile, emitter current flowing through the region being part of the emitter electrode 40E and located outside the emitter contact hole 51E has a component flowing in the second direction D2. The electrical resistance of the emitter electrode 40E to the emitter current having a component flowing in the second direction D2 is greater than the electrical resistance of the emitter electrode 40E to the emitter current flowing through the emitter electrode 40E substantially in only the thickness direction of the emitter electrode 40E.

The electrical resistance of the emitter electrode 40E is inserted in series with the electrical resistance (emitter resistance) of the emitter mesa layer 34. When the distance LE2 is greater than the distance LE1, higher resistance is inserted in series with the emitter resistance. This produces an effect equivalent to increasing the resistance value of the emitter resistance. More specifically, the SOA may be further enlarged, and much greater robustness against load fluctuations may thus be provided.

Fourth Example

Figure 12:
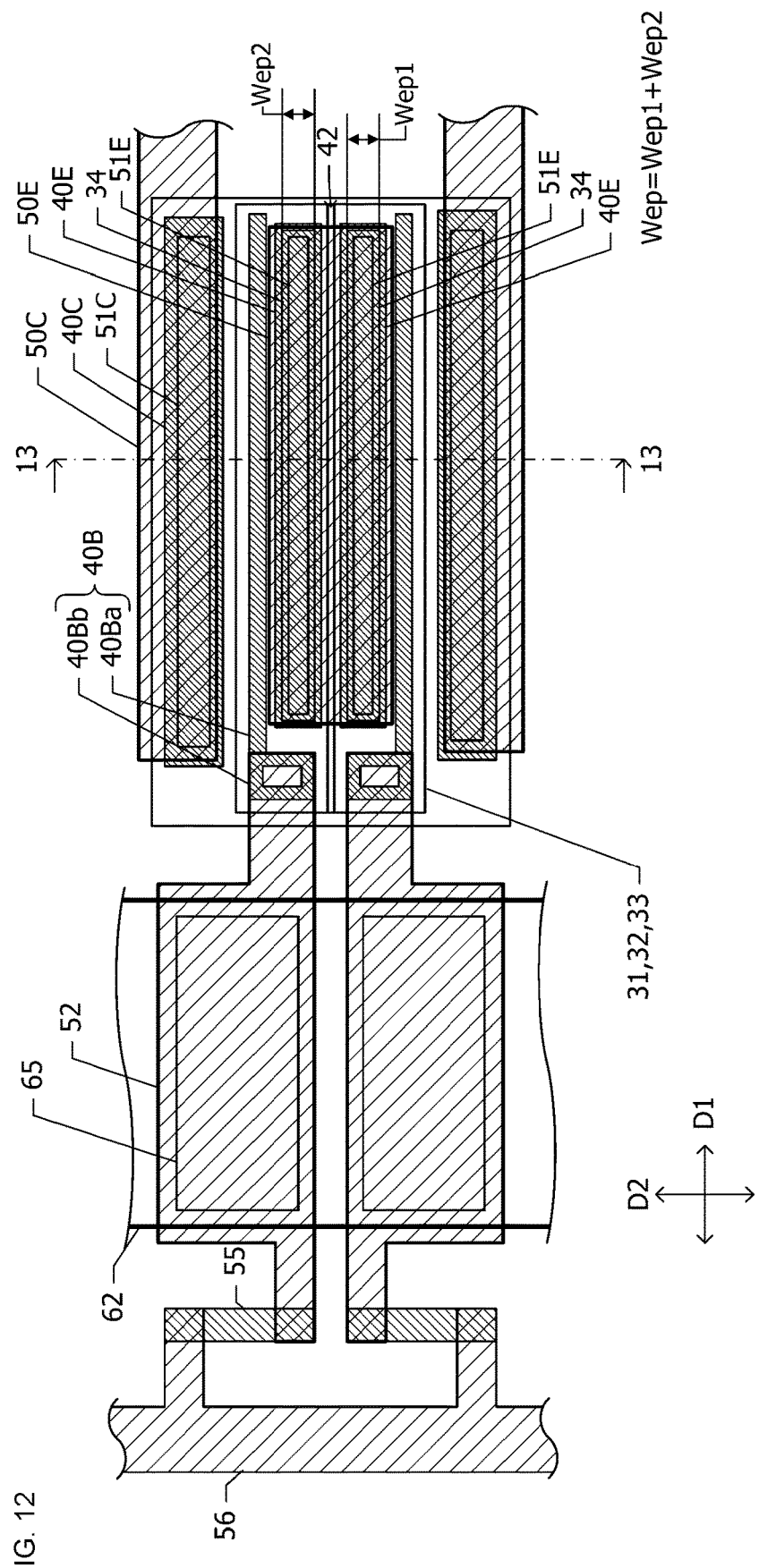
FIG. 12 illustrates planar positional relationship between constituent elements of a unit cell in a fourth example.
Figure 13:
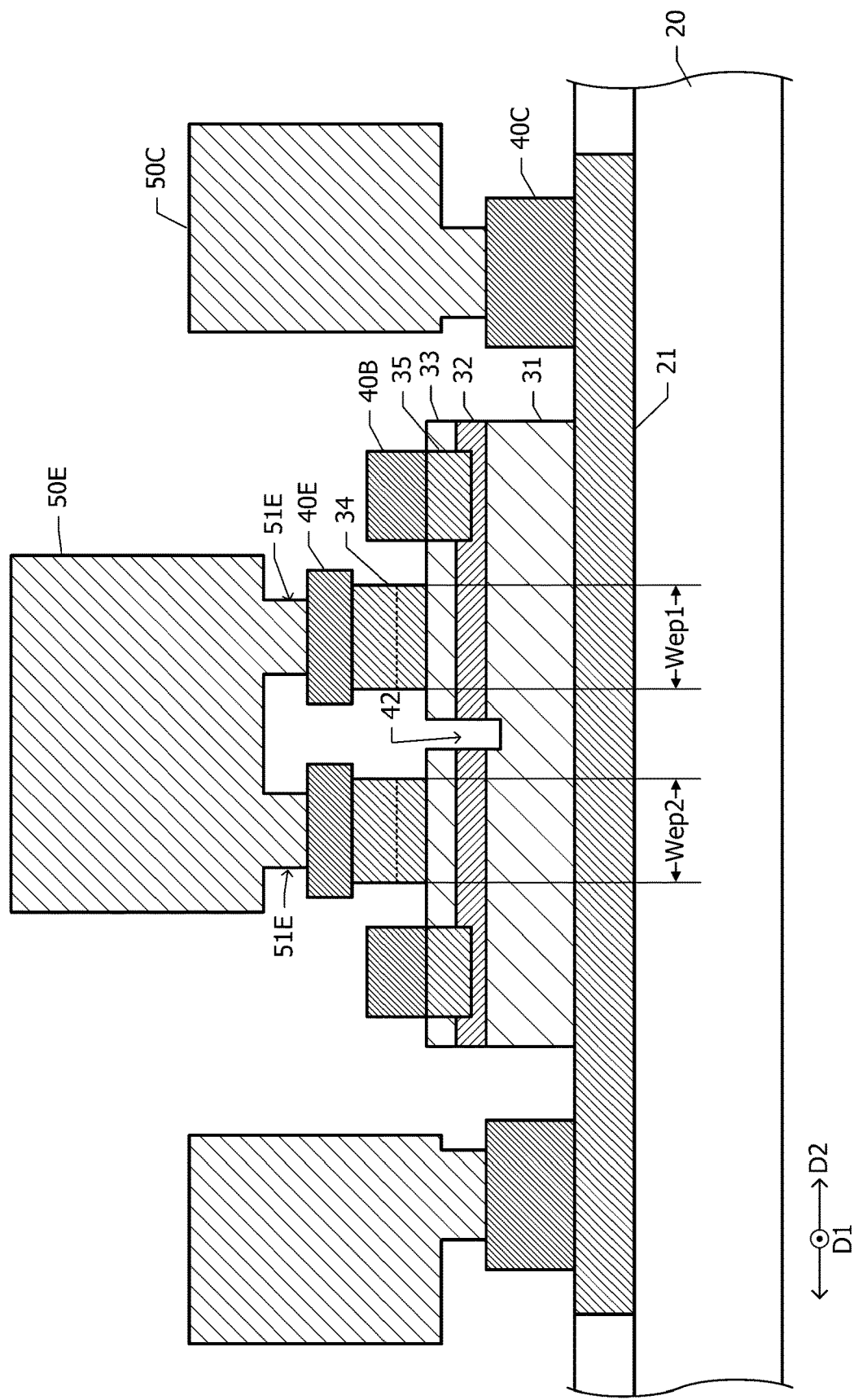
FIG. 13 is a sectional view of the unit cell taken along dash-dot line 13-13 in FIG. 12.

The following describes the unit cell 100 in the fourth example with reference to FIGS. 12 and 13. Description of configurations identical to those of the unit cells 100 in the first example (see FIGS. 1 and 2) will be omitted.

FIG. 12 illustrates planar positional relationship between constituent elements of the unit cell 100 in the fourth example. FIG. 13 is a sectional view of the unit cell taken along dash-dot line 13-13 in FIG. 12. In the first example, the periphery of the collector layer 31, the periphery of the base layer 32, and the periphery of the emitter layer 33 viewed in plan (see FIG. 1) coincide with each other. A distinctive feature of the fourth example is that the base layer 32 and the emitter layer 33 each include two regions that are separated from each other in the second direction D2 when viewed in plan. Specifically, a groove 42 (see FIG. 13) extends from an upper surface of the emitter layer 33 to the surface layer portion of the collector layer 31. When viewed in plan, the groove 42 extends in the first direction D1 so as to lie between edges of the collector layer 31 parallel to each other in the second direction D2. The upper surface of the collector layer 31 between the two regions of the base layer 32 is thus located on a level lower than an interface between the base layer 32 and the collector layer 31.

Two emitter mesa layers 34 are located within the two corresponding separate regions of the base layer 32 when viewed in plan. The two emitter mesa layers 34 are overlaid with two corresponding emitter electrodes 40E. The emitter electrodes 40E are connected to each other by one first-layer emitter line 50E. Wep1 denotes the width of one of the emitter mesa layers 34, and Wep2 denotes the width of the other emitter mesa layer 34. The sum of the width Wep1 and the width Wep2 is equal to the width Wep (see FIGS. 1 and 2) of the emitter mesa layer 34 in the first example. That is, the sum of the width Wep1 and the width Wep2 is not less than about 1.5 times the total width Wed (see FIG. 6) of the emitter mesa layers 34 of the heterojunction bipolar transistor of the driver-stage amplifier circuit 111 and is not more than about 2.5 times the total width Wed (i.e., from about 1.5 times the total width Wed of the emitter mesa layers 34 of the heterojunction bipolar transistor of the driver-stage amplifier circuit 111 to about 2.5 times the total width Wed).

Two base electrodes 40B are located within the two corresponding separate regions of the base layer 32 when viewed in plan.

The following describes advantageous effects of the fourth example.

A distinctive feature of the fourth example is that the base layer 32 is separated into two regions that are connected with the corresponding base electrodes 40B. A greater degree of electrical isolation between the two base electrodes 40B is provided accordingly. This feature thus enhances the effect of eliminating or reducing the possibility that the degree of asymmetry between flows of emitter current through the two corresponding regions of the emitter mesa layer 34 will increase. Consequently, the SOA may be further enlarged, and much greater robustness against load fluctuations may thus be provided.

Fifth Example

Figure 14:
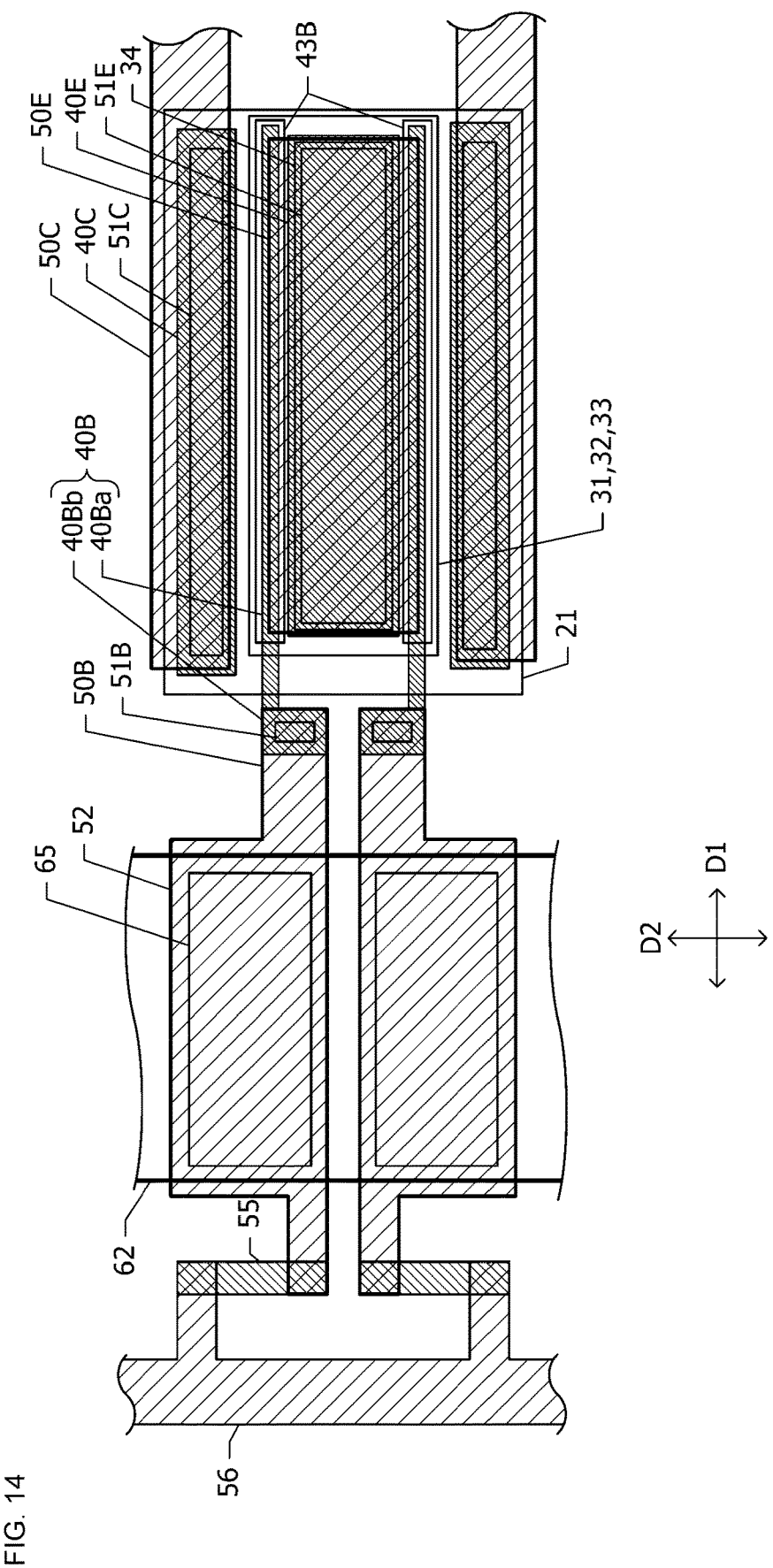
FIG. 14 illustrates planar positional relationship between constituent elements of a unit cell in a fifth example.

The following describes the unit cell 100 in the fifth example with reference to FIG. 14. Description of configurations identical to those of the unit cells 100 in the first example (see FIGS. 1 and 2) will be omitted.

FIG. 14 illustrates planar positional relationship between constituent elements of the unit cell 100 in the fifth example.

In the first example, the base-electrode pad portions 40Bb are located within the base layer 32 when viewed in plan. Distinctive feature of the fifth example are as follows. The base-electrode pad portions 40Bb are located outside the base layer 32 when viewed in plan. Furthermore, the base-electrode pad portions 40Bb are located outside the sub-collector layer 21, that is, within the element isolation region 22 (see FIG. 2) when viewed in plan. The base-electrode main portions 40Ba extend from the corresponding base-electrode pad portions 40Bb and intersect an edge of the sub-collector layer 21 and an edge of the base layer 32, lie on the base layer 32, and end short of another edge of the base layer 32.

An insulating film is disposed below the base electrodes 40B to keep the base electrodes 40B from direct contact with the semiconductor layers except for the base layer 32. The insulating film has cavities 43B, which extend along the corresponding base-electrode main portions 40Ba so as to ensure electrical continuity between each base-electrode main portion 40Ba and the base layer 32.

The following describes advantageous effects of the fifth example.

A distinctive feature of the fifth example is that two base-electrode pad portions 40Bb are disposed on the element isolation region 22 (see FIG. 2). Thus, no current flows between the two base-electrode pad portions 40Bb. A greater degree of electrical isolation between the two base electrodes 40B is provided accordingly. This feature thus enhances the effect of eliminating or reducing the possibility that the degree of asymmetry between flows of emitter current through the regions adjoining two respective edges of the emitter mesa layer 34 parallel to each other in the first direction D1 will increase. Consequently, the SOA may be further enlarged, and much greater robustness against load fluctuations may thus be provided.

These examples are merely illustrative. Needless to say, partial replacements or combinations of configurations illustrated in different examples are possible. Not every example refers to actions and effects caused by similar configurations. Furthermore, the present disclosure is not intended to be limited to the above-described examples. For example, it will be obvious to those skilled in the art that various changes, improvements, combinations, and the like may be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A unit cell comprising:
   a collector layer on a substrate, the collector layer being a continuous region when viewed in plan;
   a base layer on the collector layer;
   an emitter layer on the base layer;
   an emitter mesa layer on the emitter layer, the emitter mesa layer providing a path for emitter current carried through the emitter layer;
   two base electrodes that are located outside the emitter mesa layer and within the base layer when viewed in plan, the two base electrodes being electrically connected to the base layer;
   two capacitors on or above the substrate, each of the two capacitors being connected between a corresponding one of the two base electrodes and a first line above the substrate; and
   two resistance elements on or above the substrate, each of the two resistance elements being connected between the corresponding one of the two base electrodes and a second line on or above the substrate.

2. The unit cell according to claim 1, wherein
   the emitter mesa layer is long in a first direction when viewed in plan,
   the two base electrodes include two respective base-electrode main portions and two respective base-electrode pad portions, the two base-electrode main portions extending in the first direction, a dimension of each of the two base-electrode pad portions in a second direction orthogonal to the first direction being greater than a dimension of each of the two base-electrode main portions in the second direction, and
   the two base-electrode main portions face each other across the emitter mesa layer in the second direction when view in plan, and
   each of the two base-electrode pad portions is linked to an end portion of a corresponding one of the two base-electrode main portions.

3. The unit cell according to claim 2, further comprising:
   an insulating film on the two base electrodes, two base contact holes being provided in the insulating film and being located within the two respective base-electrode pad portions when viewed in plan,
   wherein each of the two capacitors is connected to a corresponding one of the two base-electrode pad portions through a corresponding one of the two base contact holes.

4. The unit cell according to claim 2, wherein
the emitter mesa layer is a continuous region within the base layer when viewed in plan.

5. The unit cell according to claim 2, wherein
the base layer includes two regions that are separated from each other in the second direction when viewed in plan, and
the emitter mesa layer includes two regions that are located within the two respective regions of the base layer when viewed in plan.

6. The unit cell according to claim 5, wherein
an upper surface of the collector layer between the two regions of the base layer is located on a level lower than an interface between the base layer and the collector layer.

7. The unit cell according to claim 2, further comprising:
an emitter electrode on the emitter mesa layer, the emitter electrode being in ohmic contact with the emitter mesa layer; and
an emitter line that extends through an emitter contact hole provided in an insulating film on the emitter electrode and is connected to the emitter electrode,
wherein a distance in the second direction between the emitter contact hole and an edge of the emitter mesa layer extending in the first direction is greater than a distance in the first direction between the emitter contact hole and an end of the emitter mesa layer in the first direction.

8. The unit cell according to claim 1, further comprising:
an insulating film on the two base electrodes, two base contact holes being provided in the insulating film and being located within the two respective base electrodes when viewed in plan, wherein
the emitter mesa layer is long in a first direction when viewed in plan,
the two base electrodes are long in the first direction and face each other across the emitter mesa layer in a second direction orthogonal to the first direction when viewed in plan,
the two base contact holes are long in the first direction when viewed in plan, and
each of the two capacitors are connected to the corresponding one of the two base electrodes through a corresponding one of the two base contact holes.

9. The unit cell according to claim 8, wherein
each of the two base contact holes is off-center within the corresponding one of the two base electrodes so as to be farther away from the emitter mesa layer when viewed in plan.

10. The unit cell according to claim 3, wherein
the emitter mesa layer is a continuous region within the base layer when viewed in plan.

11. The unit cell according to claim 3, wherein
the base layer includes two regions that are separated from each other in the second direction when viewed in plan, and
the emitter mesa layer includes two regions that are located within the two respective regions of the base layer when viewed in plan.

12. The unit cell according to claim 3, further comprising:
an emitter electrode on the emitter mesa layer, the emitter electrode being in ohmic contact with the emitter mesa layer; and
an emitter line that extends through an emitter contact hole provided in an insulating film on the emitter electrode and is connected to the emitter electrode,
wherein a distance in the second direction between the emitter contact hole and an edge of the emitter mesa layer extending in the first direction is greater than a distance in the first direction between the emitter contact hole and an end of the emitter mesa layer in the first direction.

13. A semiconductor device comprising the unit cell according to claim 4, wherein
the two base electrodes are located within the collector layer and the base layer when viewed in plan,
the two base-electrode pad portions are discretely located away from each other in the second direction, and
a region between the two base-electrode pad portions is not overlaid with the base layer.

14. A power amplifier module comprising:
a power-stage amplifier circuit including one or more unit cells, each unit cell being the unit cell according to claim 1; and
a driver-stage amplifier circuit including one or more bipolar transistors, each bipolar transistor including a collector layer on the substrate, a base layer on the collector layer, an emitter layer on the base layer, an emitter mesa layer on the emitter layer.

15. The power amplifier module according to claim 14, further comprising:
an interstage impedance matching circuit through which a signal amplified by the driver-stage amplifier circuit is input to the power-stage amplifier circuit.

16. The power amplifier module according to claim 14, wherein
the emitter mesa layers of the bipolar transistors of the driver-stage amplifier circuit are long in one direction when viewed in plan, and
a total width of the emitter mesa layers of the unit cells of the power-stage amplifier circuit is from 1.5 times a total width of the emitter mesa layers of the bipolar transistors of the driver-stage amplifier circuit to 2.5 times the total width of the emitter mesa layers of the bipolar transistors of the driver-stage amplifier circuit.

17. The power amplifier module according to claim 14, wherein
the first line is connected to an output terminal of the driver-stage amplifier circuit.

18. The power amplifier module according to claim 14, further comprising:
a bias circuit on the substrate, the second line being connected to the bias circuit.

19. The power amplifier module according to claim 15, wherein
the first line is connected to an output terminal of the driver-stage amplifier circuit.

20. A power amplifier module comprising:
a power-stage amplifier circuit including one or more unit cells, each unit cell being the unit cell according to claim 2; and
a driver-stage amplifier circuit including one or more bipolar transistors, each bipolar transistor including a collector layer on the substrate, a base layer on the collector layer, an emitter layer on the base layer, an emitter mesa layer on the emitter layer.

* * * * *